(12) United States Patent
Sakuma et al.

(10) Patent No.: US 7,149,116 B2
(45) Date of Patent: Dec. 12, 2006

(54) NONVOLATILE SEMICONDUCTOR MEMORY AND PROGRAMMING METHOD FOR THE SAME

(75) Inventors: Makoto Sakuma, Yokohama (JP);
Fumitaka Arai, Yokohama (JP);
Riichiro Shirota, Fujisawa (JP);
Yasuhiko Matsunaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/337,653

(22) Filed: Jan. 24, 2006

(65) Prior Publication Data
US 2006/0120159 A1 Jun. 8, 2006

Related U.S. Application Data

(62) Division of application No. 10/865,937, filed on Jun. 14, 2004, now Pat. No. 7,027,329.

(30) Foreign Application Priority Data

Jul. 4, 2003 (JP) ............................. 2003-192496

(51) Int. Cl.
*G11C 11/34* (2006.01)

(52) U.S. Cl. ..................... 365/185.14; 365/185.23; 365/185.24; 365/189.05; 365/230.04; 365/230.08

(58) Field of Classification Search ........... 365/185.14, 365/185.23, 185.24, 189.05, 230.04, 230.08
See application file for complete search history.

(56) References Cited

U.S. PATENT DOCUMENTS 5,453,955 A 9/1995 Sakui et al. ................. 365/203
6,058,044 A * 5/2000 Sugiura et al. ......... 365/185.17
6,118,703 A * 9/2000 Hamaguchi ............ 365/185.22

FOREIGN PATENT DOCUMENTS

| JP | 8-167291 | 6/1996 |
|---|---|---|
| JP | 8-329700 | 12/1996 |
| JP | 11-176164 | 7/1999 |
| JP | 11-297080 | 10/1999 |
| JP | 2001-168306 | 6/2001 |
| JP | 2002-279788 | 9/2002 |

* cited by examiner

*Primary Examiner*—Richard Elms
*Assistant Examiner*—Pho M. Luu
(74) *Attorney, Agent, or Firm*—Oblon, Spivak, McClelland, Maier & Neustadt, P.C.

(57) ABSTRACT

A semiconductor memory has a memory cell matrix including a plurality of first and second cell columns alternately arranged along a row-direction, each of cell columns is implemented by a plurality of memory cell transistors, and peripheral circuits configured to drive the memory cell matrix and to read information from the memory cell matrix. The peripheral circuit encompasses (a) a leading program circuit configured to write first data into memory cell transistors in the first cell columns, (b) a lagging program circuit configured to write second data into memory cell transistors in the second cell columns after the first data are written, and (c) a voltage controller configured to control variation of threshold voltages for the memory cell transistors of the first cell columns.

7 Claims, 17 Drawing Sheets

$\Delta VCG \propto 1/L$

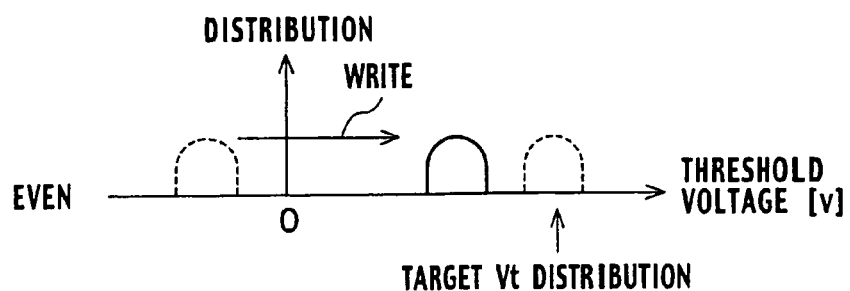
FIG. 7A EVEN
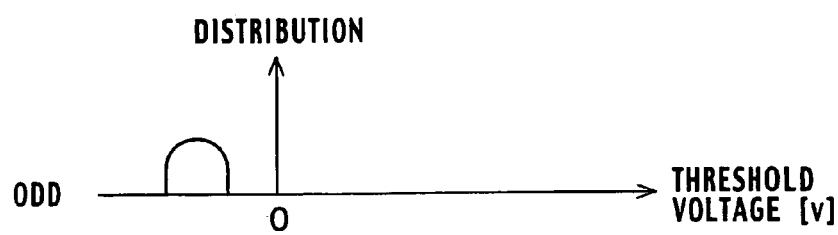
FIG. 7B ODD
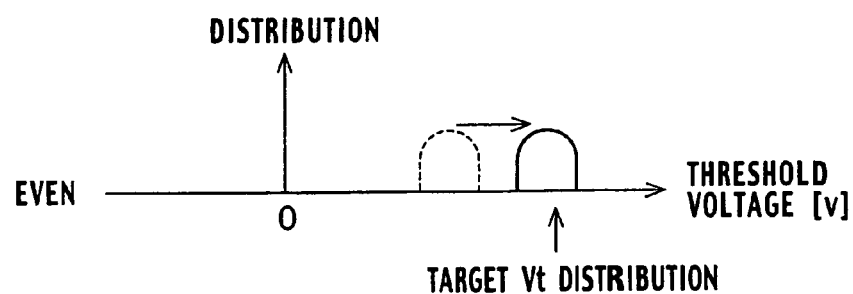
FIG. 8A EVEN
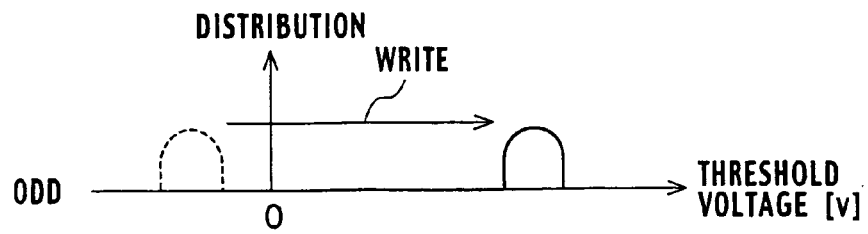
FIG. 8B ODD

EVEN

ODD

NONVOLATILE SEMICONDUCTOR MEMORY AND PROGRAMMING METHOD FOR THE SAME

CROSS REFERENCE TO RELATED APPLICATIONS

This application is a Divisional of application Ser. No. 10/865,937 filed Jun. 14, 2004 now U.S. Pat. No. 7,027,329, issued on Apr. 11, 2006, and claims priority under 35 U.S.C. 120. This application also claims benefit under 35 USC 119 based on Japanese Patent Application No. P2003-192496 filed Jul. 4, 2003. The entire contents of both are incorporated by reference herein.

BACKGROUND OF THE INVENTION

1. Field of the Invention

The present invention relates to a semiconductor memory. It is particularly related to a nonvolatile semiconductor memory and a data programming method thereof.

2. Description of the Related Art

Inter-cell spacing of semiconductor memories has been decreasing at approximately 30% per annum through evolutions toward high integration and miniaturization architectures. With nonvolatile semiconductor memories having a plurality of memory cell transistors, each encompassing a first conductive layer (a floating gate electrode), a second conductive layer (a control gate electrode) and an inter-electrode dielectric sandwiched in between the first and second conductive layers, it is possible to store data in memory cell transistors by storing electric charges in respective conductive layers, which are made of, for example, polycrystalline silicon layers, kept in a floating state. As can be understood in a cross sectional view cut along the word line direction of a miniaturized nonvolatile semiconductor memory, since first conductive layers belonging to adjacent cell columns oppose each other across a device isolation film sandwiched in between the adjacent cell columns, "inter-column coupling" occurs between the first conductive layers belonging to adjacent cell columns due to capacitive coupling between the opposing side surfaces of these mutually opposing first conductive layers. The device isolation films sandwiched in between the adjacent cell columns may implement shallow trench isolation (STI) architecture, for example.

As the nonvolatile semiconductor memory becomes scaled down, the mutually facing area of first and second conductive layers becomes smaller. However, it is necessary to ensure a sufficient capacitance between first and second conductive layers through the inter-electrode dielectric. In other words, achievement of required area for inter-electrode dielectric in a three-dimensional structure becomes impossible as a result of the reduced inter-cell spacing, and it becomes necessary to use an insulating film with a higher dielectric constant than before as the inter-electrode dielectric to achieve required capacitance.

However, the inter-column couplings causes disturbance in the memory cell performances if a high dielectric is used as the inter-electrode dielectric. For example, because the conductive coupling between the first conductive layers belonging to adjacent cell columns becomes significant due to the transport of mobile carriers through a high dielectric for the inter-electrode dielectric, the inter-column coupling increases. Japanese Patent Application Laid-open No. 2001-168306 proposed a structure for suppressing the inter-column coupling.

Furthermore, the effect of inter-column coupling becomes noticeable since capacitive coupling between the first conductive layers increases owing to the employment of high dielectric for the inter-electrode dielectric.

Therefore, in a miniaturized nonvolatile semiconductor memory, as the inter-cell spacing decreases, the inter-column coupling drastically increases between a "written cell" retaining electric charges and an "erased cell" not retaining electric charges. For example, as shown in FIG. 2A, if an even-numbered cell column is programmed (written) and verified, and then an odd-numbered cell column is similarly programmed (written) and verified as shown in FIG. 3B, a threshold voltage Vt for the first verified even-numbered cell column increases due to the inter-column coupling, exceeding the target threshold voltage distribution illustrated in FIG. 3A, thereby causing erroneous programming.

SUMMARY OF THE INVENTION

An aspect of present invention inheres in a semiconductor memory having a memory cell matrix including a plurality of first and second cell columns alternately arranged along a row-direction, each of cell columns is implemented by a plurality of memory cell transistors serially connected along a column-direction and a select transistor configured to select the memory cell transistors, and peripheral circuits configured to drive the memory cell matrix and to read information from the memory cell matrix. Here, the peripheral circuit encompasses (a) a leading program circuit configured to write first data into memory cell transistors in the first cell columns; (b) a lagging program circuit configured to write second data into memory cell transistors in the second cell columns after the first data are written into the memory cell transistors in the first cell columns; and (c) a voltage controller configured to control variation of threshold voltages for the memory cell transistors of the first cell columns, the variation ascribable to amount of electric charges in the memory cell transistors of the second cell columns.

Another aspect of present invention inheres in a programming method of semiconductor memory having a memory cell matrix including a plurality of first and second cell columns alternately arranged along a row-direction, each of cell columns is implemented by a plurality of memory cell transistors serially connected along a column-direction and a select transistor configured to select the memory cell transistors, and peripheral circuits configured to drive the memory cell matrix and to read information from the memory cell matrix. Here, the peripheral circuit, the programming method encompasses (a) latching first data configured to be written into memory cell transistors in the first cell columns; (b) latching second data configured to be written into memory cell transistors in the second cell columns after the first data are written into the memory cell transistors in the first cell columns; (c) comparing the first data with the second data so as to determine shift of threshold voltages of memory cell transistors in the first cell columns, which are estimated to be induced by electric charges written in the memory cell transistors of the second cell columns; (d) writing electric charges into memory cell transistors in the first cell columns, which correspond to the determined shift of threshold voltages; and (e) writing second data into memory cell transistors in the second cell columns after the first data are written into the memory cell transistors in the first cell columns.

Still another aspect of present invention inheres in a programming method of semiconductor memory having a memory cell matrix including a plurality of first and second cell columns alternately arranged along a row-direction, each of cell columns is implemented by a plurality of memory cell transistors serially connected along a column-direction and a select transistor configured to select the memory cell transistors, and peripheral circuits configured to drive the memory cell matrix and to read information from the memory cell matrix, the peripheral circuit. Here, the programming method encompasses (a) writing first data into memory cell transistors in the first cell columns with initial electric charges, which is smaller than the amount required to achieve target threshold voltage of memory cell transistors in the first cell columns; (b) writing second data into memory cell transistors in the second cell columns after the first data are written into the memory cell transistors in the first cell columns; (c) measuring shifted threshold voltages of memory cell transistors in the first cell columns, which are induced by electric charges written in the memory cell transistors of the second cell columns; and (d) additionally writing electric charges into memory cell transistors in the first cell columns by amount equivalent to potential difference between target threshold voltage and the measured shifted threshold voltages of memory cell transistors in the first cell columns.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 7A is a schematic diagram illustrating a threshold voltage distribution due to a program operation into a even column in the semiconductor memory according to the first embodiment of the present invention;

FIG. 7B is a schematic diagram illustrating threshold voltage distributions in a odd column associated with a program operation into the even column shown in FIG. 7A;

FIG. 8A illustrates a shift in the threshold voltage distribution in the even column from the state shown in FIG. 7A, due to a program operation into the odd column shown in FIG. 8B;

FIG. 8B illustrates a change in the threshold voltage distribution in the odd column from the state shown in FIG. 7B, due to the program operation into the odd column, which is executed after the program operation into the even column shown in FIG. 7A;

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Figure 1:
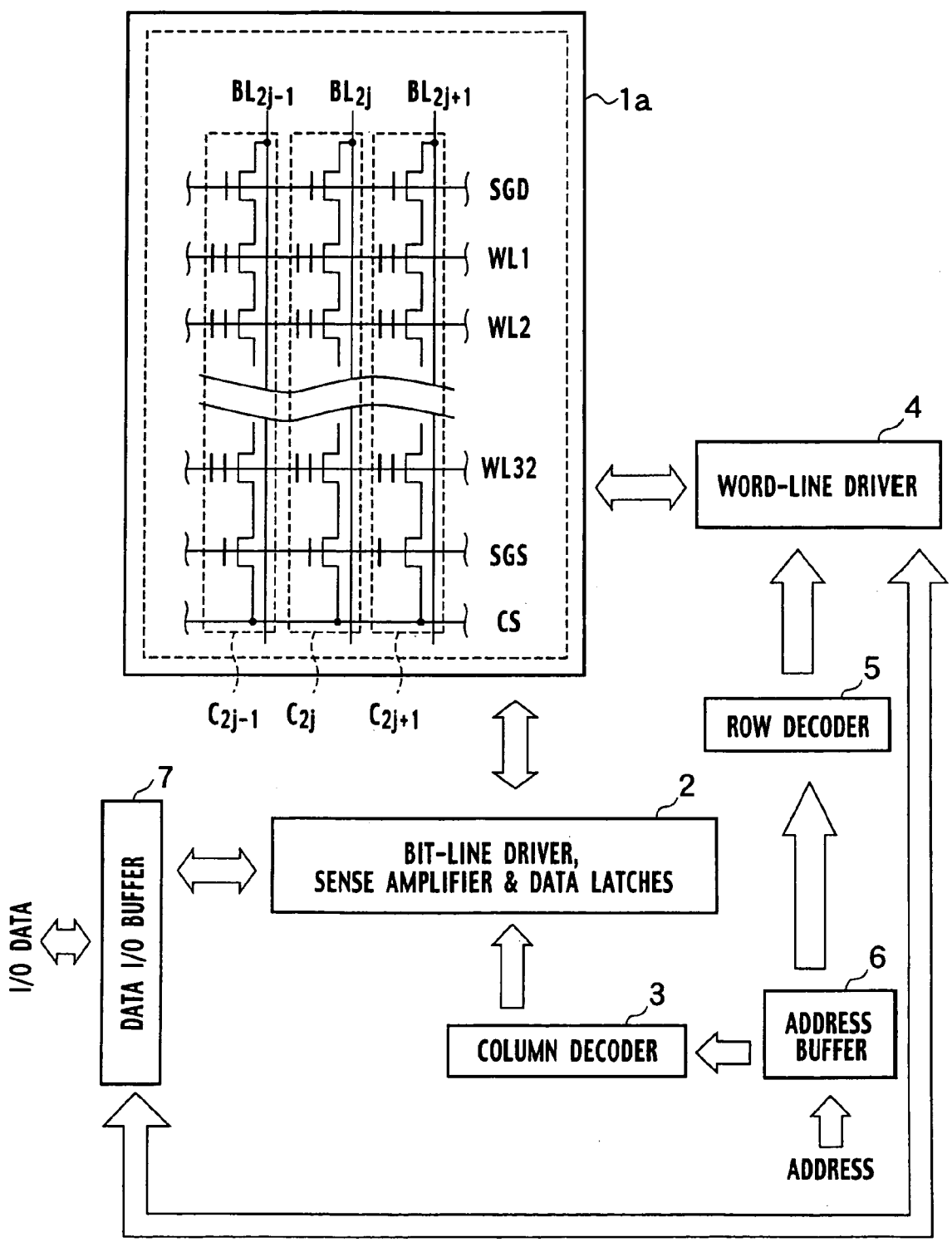
FIG. 1 is a block diagram illustrating an earlier semiconductor memory.
Figure 2A:
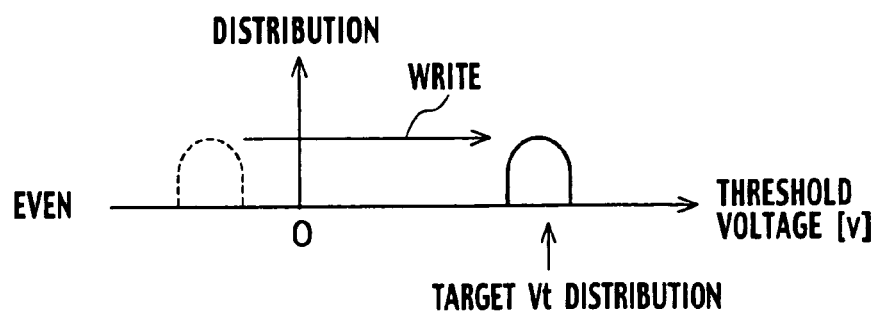
FIG. 2A is a schematic diagram illustrating a threshold voltage distribution due to a program operation into a even column in the earlier semiconductor memory.
Figure 2B:
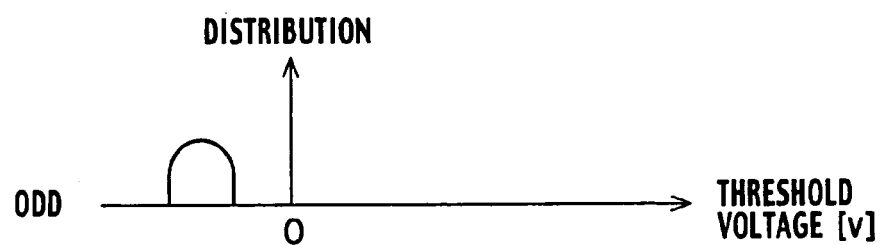
FIG. 2B is a schematic diagram illustrating threshold voltage distributions in a odd column associated with a program operation into the even column.
Figure 3A:
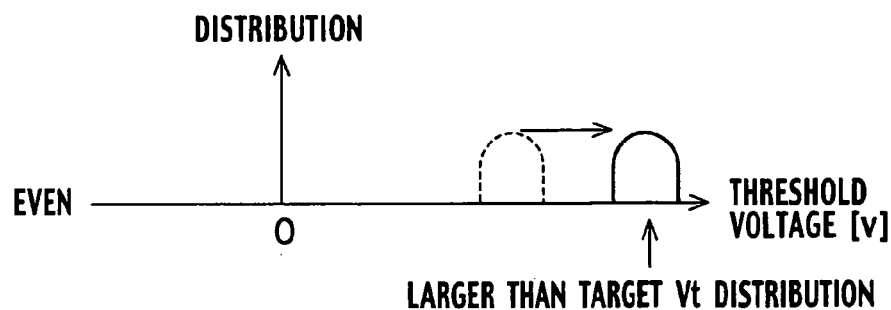
FIG. 3A illustrates a shift in the threshold voltage distribution in the even column from the state shown in FIG. 2A, due to a program operation into the odd column shown in FIG. 3B.
Figure 3B:
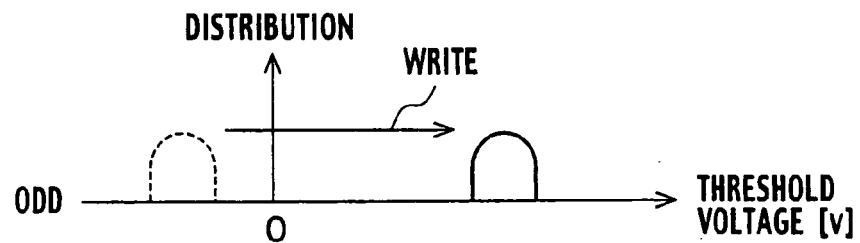
FIG. 3B illustrates a change in the threshold voltage distribution in the odd column from the state shown in FIG. 2B, due to the program operation into the odd column, which is executed after the program operation into the even column shown in FIG. 2A.
Figure 4:
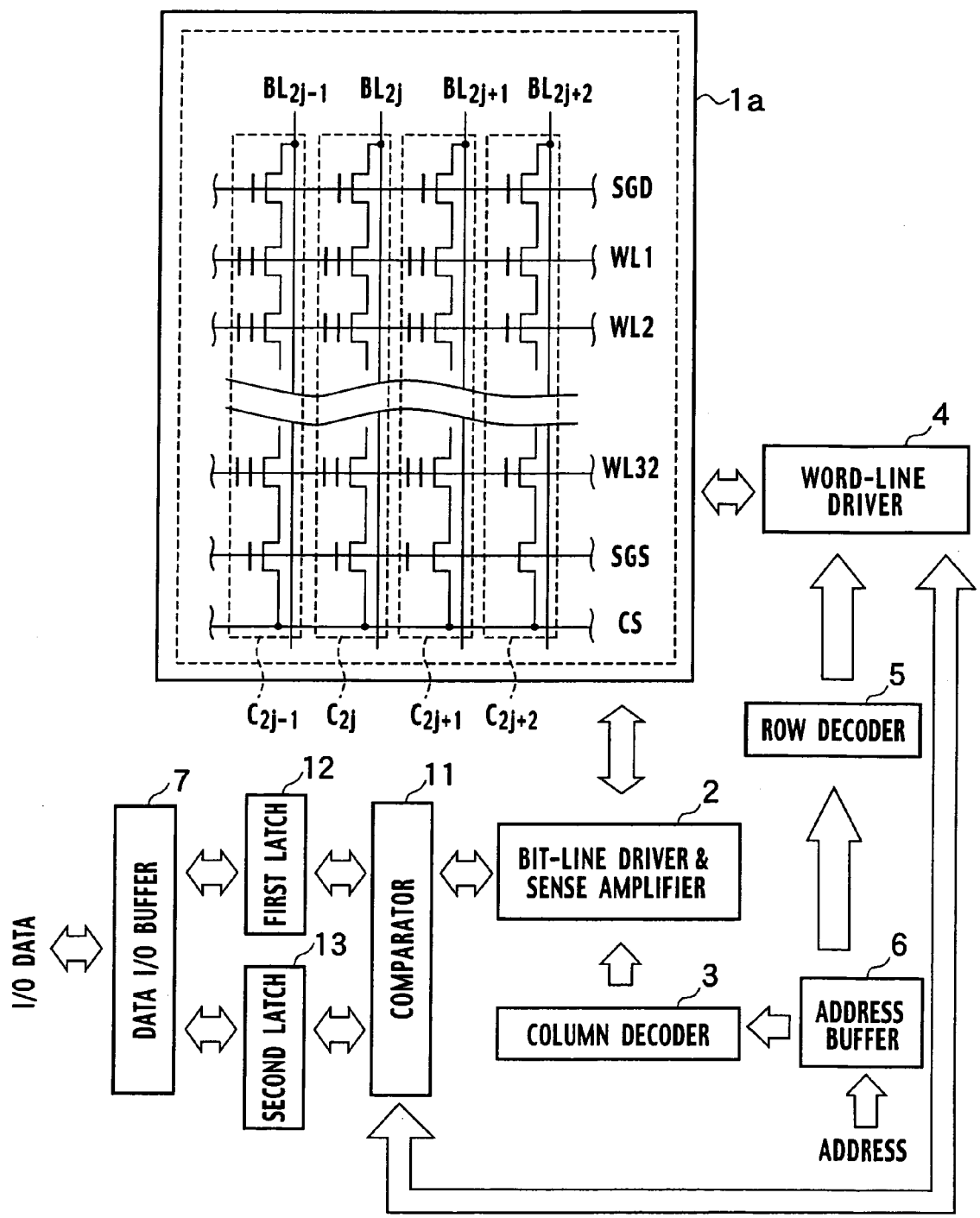
FIG. 4 is a block diagram illustrating a semiconductor memory according to the first embodiment of the present invention.
Figure 5:
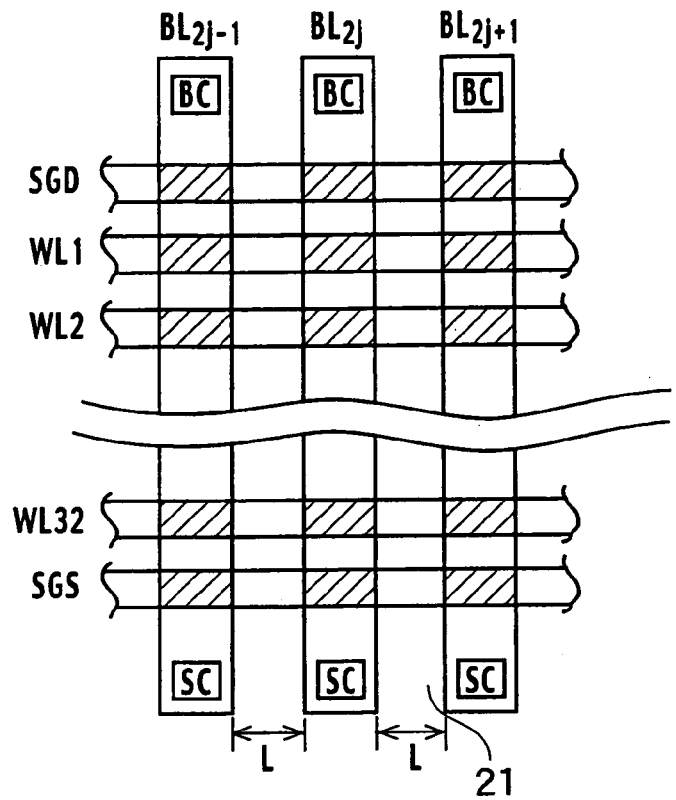
FIG. 5 is a layout pattern illustrating part of a memory cell matrix of the semiconductor memory according to the first embodiment of the present invention.

1. First Embodiment 1.1 Memory Organization:

A semiconductor memory according to a first embodiment of the present invention, as shown in FIGS. 4 and 5, is a NAND Flash memory encompassing a memory cell matrix 1a embracing plural cell columns $C_{2j-1}$, $C_{2j}$, $C_{2j+1}$, . . . extending along a column-direction, the cell columns $C_{2j-1}$, $C_{2j}$, $C_{2j+1}$, . . . are arranged along a row-direction in parallel. The cell columns $C_{2j-1}$, $C_{2j}$, $C_{2j+1}$, . . . are assigned by even-numbered cell columns (hereafter referred to as "even columns") $C_{2j}$, $C_{2j+2}$, . . . and odd-numbered cell columns (hereafter, referred to as "odd columns") $C_{2j-1}$, $C_{2j+1}$, . . . , which are alternately arranged along a row-direction so as to achieve an interdigital configuration, or an alternate-finger configuration. Plural memory cell transistors serially arranged along the column-direction implement each of cell columns $C_{2j-1}$, $C_{2j}$, $C_{2j+1}$, . . . . Each of the memory cell transistors has a charge accumulation layer whose electric charge accumulation level is configured to be controlled separately. The horizontal lines connected to all the memory cell transistors in a row are called the word lines WL1 through WL32.

In other words, the semiconductor memory according to the first embodiment of the present invention, as shown in FIGS. 4 and 5, encompasses plural word lines WL1, WL2, . . . WL32 arranged along the row-direction, and plural bit lines $BL_{2j-1}$, $BL_{2j}$, $BL_{2j+1}$, . . . arranged along the column-direction orthogonal to these word lines WL1, WL2, . . . WL32. The vertical lines $BL_{2j-1}$, $BL_{2j}$, $BL_{2j+1}$, . . . , along which the data flow in and out of the memory cell transistors, are called the bit lines. In addition, memory cell transistors, which have respective charge accumulation layers whose electric charge accumulation levels can be controlled separately using plural word lines WL1, WL2, . . . WL32, are arranged along the row-direction in FIGS. 4 and 5. FIGS. 4 and 5 illustrate the case where 32 memory cell transistors are arranged along the column-direction so as to implement each of the cell columns $C_{2j-1}$, $C_{2j}$, $C_{2j+1}$, . . . . Pair of select transistors, which select a group of memory cell transistors serially arranged in the cell column $C_{2j-1}$, $C_{2j}$, $C_{2j+1}$, . . . , are arranged at both ends of respective cell columns $C_{2j-1}$, $C_{2j}$, $C_{2j+1}$, . . . . The plural cell columns $C_{2j-1}$, $C_{2j}$, $C_{2j+1}$, . . . are arranged in parallel, close to each other. Upper select gate line SGD is connected to the respective gates of upper select transistors. Lower select gate line SGS is connected to the respective gates of the lower select transistors. The drain electrode of the upper select transistors are connected to the corresponding bit lines $BL_{2j-1}$, $BL_{2j}$, $BL_{2j+1}$, . . . . The source electrode of the upper select transistors are connected to the drain electrodes of the uppermost memory cell transistor in the corresponding cell columns $C_{2j-1}$, $C_{2j}$, $C_{2j+1}$, . . . . The drain electrode of the lower select transistors are connected to the source electrodes of the lowermost memory cell transistor in the corresponding cell columns $C_{2j-1}$, $C_{2j}$, $C_{2j+1}$, . . . , and the source electrode of the lower select transistors are connected to the common source line CS. As it will be appreciated, the terms drain and source can be exchanged without modifying the structure itself.

The semiconductor memory according to the first embodiment of the present invention, as shown in FIG. 4, further encompasses peripheral circuits (2, 3, 4, 5, 6, 7, 11, 12, 13) configured to drive the memory cell matrix 1a and to read information from the memory cell matrix 1a. The peripheral circuits (2, 3, 4, 5, 6, 7, 11, 12, 13) include a comparator 11, a first latch 12 connected to the comparator 11, a second latch 13 connected to the comparator 11, a bit-line driver 2 connected to the comparator 11 and a word-line driver 4 connected to the comparator 11. Furthermore, the peripheral circuits (2, 3, 4, 5, 6, 7, 11, 12, 13) include a column decoder 3 connected to the bit-line driver 2, and a row decoder 5 is connected to the word-line driver 4. In addition, an address buffer 6 is connected to the column decoder 3 and the row decoder 5.

An address signal from the address buffer 6 is fed to the bit-line driver 2 via the column decoder 3, and is further transferred to the word-line driver 4 via the row decoder 5. The bit-line driver 2 is connected to the bit lines $BL_{2j-1}$, $BL_{2j}$, $BL_{2j+1}$, . . . of the memory cell matrix 1a, and performs data write-in (programming), read-out, rewrite (re-programming), and read-out for verification. The word-line driver 4 is connected to the word lines WL1, WL2, . . . , WL32 and the upper select gate line SGD and the lower select gate line SGS, and controls the potential of control gate electrodes of the memory cell transistors and gate electrodes of the select transistors.

The peripheral circuits (2, 3, 4, 5, 6, 7, 11, 12, 13) of the semiconductor memory according to the first embodiment implement a leading program circuit, a lagging program circuit, and a voltage controller. Here, the "leading program circuit" writes data into respective memory cell transistors in first cell columns—for example, even columns $C_{2j}$, $C_{2j+2}$, . . . as shown in FIG. 4. After the even columns $C_{2j}$, $C_{2j+2}$, . . . have been written, the "lagging program circuit" writes data into respective memory cell transistors in second cell columns—odd columns $C_{2j-1}$, $C_{2j+1}$, . . . . In addition, the "voltage controller" controls the variation of the threshold voltages Vts for the memory cell transistors belonging to the first cell columns, or the even columns $C_{2j}$, $C_{2j+2}$, . . . ascribable to the amount of electric charges in the memory cell transistors belonging to the second cell columns, or the odd columns $C_{2j-1}$, $C_{2j+1}$, . . . .

Hereinafter, the case in which the even columns $C_{2j}$, $C_{2j+2}$, ... are assigned as the first cell columns, and the odd columns $C_{2j-1}$, $C_{2j+1}$, ... are assigned as the second cell columns, will be described, for example; however, reversal of the order such that assigning the odd columns $C_{2j-1}$, $C_{2j+1}$, ... as the first cell columns, and the even columns $C_{2j}$, $C_{2j+2}$, ... as the second cell columns, is of course possible Data to be written into the even columns $C_{2j}$, $C_{2j+2}$, ... of the memory cell matrix 1a is latched by the first latch 12, and data to be written into the odd columns $C_{2j-1}$, $C_{2j+1}$, ... is latched by the second latch 13 (alternatively, as described above, the data for the odd columns $C_{2j-1}$, $C_{2j+1}$, ... may be latched by the first latch 12, and the data for the even columns $C_{2j}$, $C_{2j+2}$, ... may be latched by the second latch 13.). In other words, the data (input/output data) to be written into the memory cell matrix 1a are fed to the first latch 12 or the second latch 13 via an input/output data buffer 7.

The comparator 11 connected to the first latch 12 and the second latch 13 compares the data latched by the first latch 12 and the second latch 1 and then determines the cell programming state of the memory cell matrix 1a. The first latch 12 and the second latch 13 may latch programming data for writing into memory cell transistors as well as latch rewrite data for rewriting the memory cell transistors.

The bit-line driver 2 includes a sense amplifier, which is mainly implemented by a CMOS flip flop (FF) and which performs a sensing operation for detecting the potential of the bit lines $BL_{2j-1}$, $BL_{2j}$, $BL_{2j+1}$, ... of the memory cell matrix 1a, and a sensing operation for verify-reading after cell programming has been performed.

All of the peripheral circuits such as the first latch 12, the second latch 13, the comparator 11, the bit-line driver 2, the word-line driver 4, the column decoder 3, the word-line driver 4, the row decoder 5, and the address buffer 6 shown in FIG. 4 may be monolithically integrated onto the same semiconductor chip as the memory cell matrix 1a; moreover, it may be implemented by a hybrid integrated circuit architecture, where some of the first latch 12, the second latch 13, the comparator 11, the bit-line driver 2, the word-line driver 4, the column decoder 3, the word-line driver 4, the row decoder 5, and the address buffer 6 are divided into groups so that the respective group can be assigned to different semiconductor chips.

Figure 6:
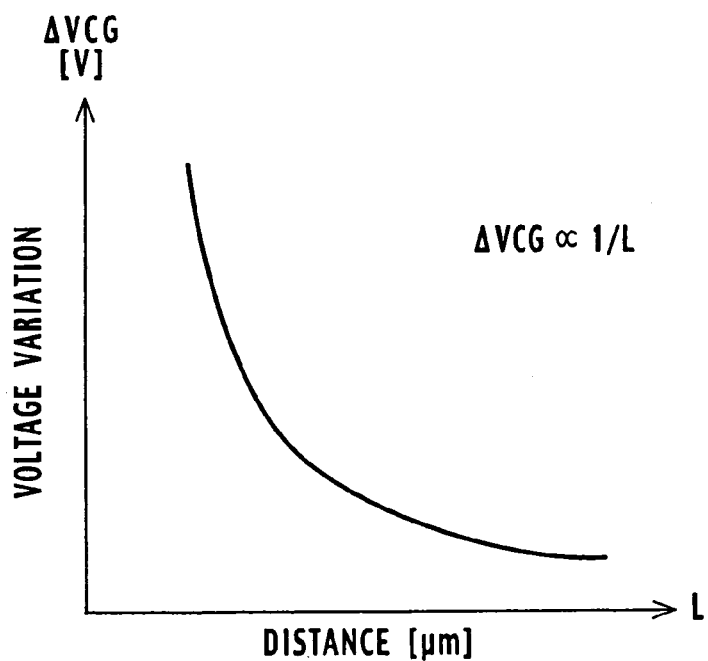
FIG. 6 is a graph illustrating the relationship between electrical potential changes in a control gate electrode due to inter-column couplings and the distance (inter-cell spacing) between adjacent memory cell transistors in NAND Flash memory.

FIG. 6 shows the relationship between inter-column couplings and distances (inter-cell spacings) in the semiconductor memory according to the first embodiment. The inter-cell spacing between adjacent memory cell transistors is given as L. It shows that in the case of first writing into the even columns $C_{2j}$, $C_{2j+2}$, ..., which are the first cell columns, and then writing into the adjacent odd columns $C_{2j-1}$, $C_{2j+1}$, ..., which are the second cell columns, potential change $\Delta Vcg$ for the control gate electrodes of the memory cell transistors in the even columns $C_{2j}$, $C_{2j+2}$, ... decreases as the inter-cell spacing L between the adjacent memory cell transistors increases. In other words, potential change $\Delta Vcg$ for the control gate electrodes of the even columns $C_{2j}$, $C_{2j+2}$, ..., or the first cell columns, is in proportion to $1/L$.

With the semiconductor memory according to the first embodiment, erroneous programming may be prevented by controlling changes in the threshold voltage Vt due to the inter-column coupling even if the minimum line width becomes finer than 100 nm.

1.2 Basic Operation of the Semiconductor Memory:

Next, basic operations of the semiconductor memory (NAND EEPROM-based Flash memory) according to the first embodiment shown in FIG. 4 are described. In order to make the following description clearly understandable, it is assumed that the memory cell transistors store data "0" and data "1". And a low level of the threshold voltage Vt such as a negative threshold voltage Vt is defined to be "0" state, and a high level of the threshold voltage Vt such as a positive threshold voltage Vt is defined to be "1" state. In addition, for the memory cell transistors, "0" state is called as an "erased state", and "1" state is called as a "programmed state". "Write-in" includes "0" write-in and "1" write-in, where "0" write-in means maintaining an erased state ("0" state), and "1" write-in means changing from "0" state to "1" state.

1.2.1 Program Operation:

In the program operation, the potential of the bit lines $BL_{2j-1}$, $BL_{2j}$, $BL_{2j+1}$, ... is set to a value in accordance with programming data for selected memory cell transistors connecting thereto. For example, the potential is set to a ground potential (0V) Vss when the programming data is "1" (in the case of "1" write-in), and is set to a source voltage Vcc when the programming data is "0" (in the case of "0" write-in). In addition, the potential of the upper select gate line SGD is set to the source voltage Vcc, and the potential of the lower select gate line SGS on ground potential side is set to ground potential (0V) Vss. In the case of "1" write-in, ground potential (0V) Vss is transmitted to the channel of the selected memory cell transistor. On the other hand, in the case of "0" write-in, the potential of the channel of a selected memory cell transistor becomes $Vcc-V_{thsg}$ ($V_{thsg}$ is the threshold voltage Vt for select transistors). Subsequently, since upper select transistors whose gate electrodes are connected to the upper select gate line SGD become cut off state, the channel of the selected memory cell transistor enters into a floating state while maintaining the potential $Vcc-V_{thsg}$.

It should be noted that in the case where the selected memory cell transistor is not the closest memory cell transistor neighboring to the upper select transistor, and the threshold voltage Vt of another memory cell transistor located between the upper select transistor and the selected memory cell transistor (in the case such that a plurality of another memory cell transistors are aligned between the upper select transistor and the selected memory cell transistor, at least one of the aligned memory cell transistors therebetween) is positive voltage $V_{thcell}$, the channel of the selected memory cell transistor enters a floating state while maintaining the potential $Vcc-V_{thcell}$.

Subsequently, into the control gate electrodes of the selected memory cell transistors sharing the selected word line, a write-in voltage Vpp of approximately 20V is applied, for example. And to the control gate electrodes of the unselected memory cell transistors connected to unselected word lines, an intermediate voltage $V_{pass}$ of approximately 10V is applied, for example. Since the channel potential for the selected memory cell transistor for "1" write-in is set to be ground potential (0V) Vss, a high voltage necessary for "1" write-in is applied between the floating gate electrode and the channel, and electrons are injected from the channel to the floating gate electrode by the Fowler-Nordheim (F-N) tunneling effect. As a result, the threshold voltage Vt for the selected memory cell transistor rises, changing from negative to positive voltage, for example.

On the other hand, the channel potential of the selected memory cell transistor for "0" write-in is set to be $Vcc-V_{thsg}$ or $Vcc-V_{thcell}$, the channel is set to be a floating state. Therefore, if voltage Vpp or $V_{pass}$ is applied to a word line, the channel potential of the selected memory cell transistor rises due to capacitive coupling between the control gate electrode and the channel. As a result, a high voltage necessary for "1" write-in can not be applied between the floating gate electrode and the channel of the selected memory cell transistor, and the threshold voltage Vt for the selected memory cell transistor maintains its current state, namely an erased state.

1.2.2 Erase Operation:

With data erase operation, once all of the word lines (control gate electrodes) WL1, WL2, . . . , WL32 are set to 0V, and the upper select gate line SGD and the lower select gate line SGS are set to an initial voltage Va, they are entered into a floating state. A high voltage $V_{ppE}$ for erase such as approximately 20V is then applied to p well regions implementing the memory cell transistors. At this time, since the potential of the word lines (control gate electrodes) is 0V, and the potential of the p well regions is $V_{ppE}$, a substantially high voltage for erase is applied between the control gate electrodes and the p well regions. Accordingly, in all of the memory cell transistors, due to the F-N tunneling effect, the electrons in the floating gate electrodes are injected into the p well regions, and the threshold voltage Vt for the memory cell transistors decreases, becoming negative voltage, for example.

1.2.3 Read-Out Operation:

Changing the potential of the bit lines $BL_{2j-1}$, $BL_{2j}$, $BL_{2j+1}$, . . . in accordance with data stored in the memory cell transistors, and then detecting these changes implement data read-out operation.

To begin with, once the bit lines (i.e., all bit lines or part of the bit lines in the case of employing "shielded bit lines") $BL_{2j-1}$, $BL_{2j}$, $BL_{2j+1}$, . . . , which are connected to the cell columns including objective memory cell transistors for data read-out, are pre-charged, and these bit lines $BL_{2j-1}$, $BL_{2j}$, $BL_{2j+1}$, . . . are then set to a pre-charged potential such as source voltage Vcc, the objective memory cell transistors are entered into a floating state.

Subsequently, the control gate electrodes of the selected memory cell transistors sharing the selected word line is set to 0V, and the unselected word lines (the control gate electrodes of the unselected memory cell transistors) and the upper select gate line SGD are set to a source voltage Vcc of approximately 3V, for example. When data in the selected memory cell transistor is "1", that is, when the threshold voltage Vt for the memory cell transistor is greater than 0, since the selected memory cell transistor turns off, the bit lines $BL_{2j-1}$, $BL_{2j}$, $BL_{2j+1}$, . . . connected to this memory cell transistor maintain the pre-charged potential.

On the other hand, when data in the selected memory cell transistor is "0", that is, when the threshold voltage Vt for the memory cell transistor is less than 0, the selected memory cell transistor turns on. As a result, the electric charges in the bit lines $BL_{2j-1}$, $BL_{2j}$, $BL_{2j+1}$, . . . , which are connected to the cell columns including the selected memory cell transistor, are discharged, and the potential of those bit lines drops from the pre-charged potential by ΔV.

As such, since the potential of the bit lines $BL_{2j-1}$, $BL_{2j}$, $BL_{2j+1}$, . . . changes in accordance with the data stored in the memory cell transistors, the data stored in the memory cell transistors can be read out by the sense amplifiers in the bit-line driver 2, detecting these potential changes.

Figure 9:
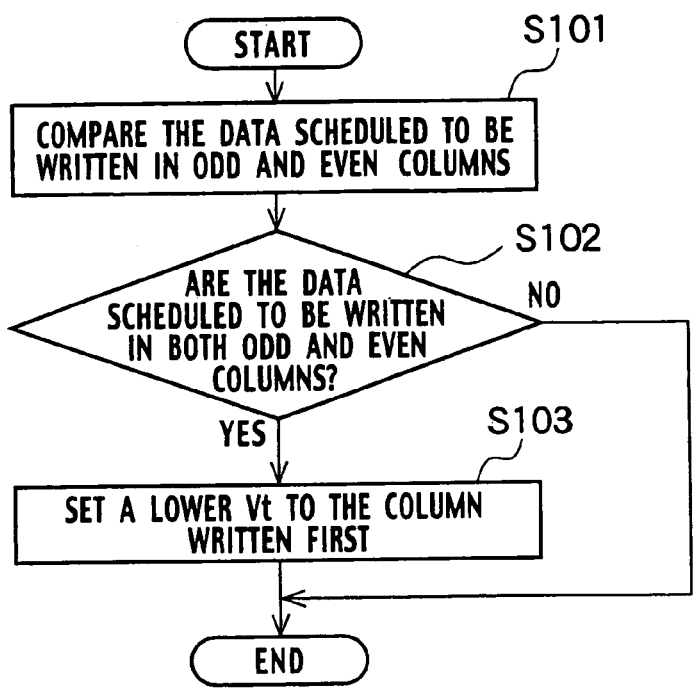
FIG. 9 is a flow chart for describing a method of setting the threshold voltage Vt for the semiconductor memory according to the first embodiment of the present invention.

1.3 VT Controlled Programming Method:

1.3.1 Threshold Voltage Control:

A threshold voltage control method for the data programming architecture of the semiconductor memory according to the first embodiment is described referencing FIG. 9. Here, the case where first data for the even columns $C_{2j}$, $C_{2j+2}$, . . . is latched by the first latch 12, assigning these columns as the first cell columns, and second data for the odd columns $C_{2j-1}$, $C_{2j+1}$, . . . is latched by the second latch 13, assigning these columns as the second cell columns is described.

(a) In step S101, the first data for the even columns $C_{2j}$, $C_{2j+2}$, . . . latched by the first latch 12 and the second data for the odd columns $C_{2j-1}$, $C_{2j+1}$, . . . latched by the second latch 13 are compared;

(b) Next, in step S102, if "1" is determined to be latched by both of the first latch 12 and the second latch 13, the procedure proceeds to step S103. Otherwise, in step S102, if "1" is not determined to be latched by both the first latch 12 and the second latch 13, processing for setting the threshold voltage Vt is not carried out, and the procedure completes; and (c) In step S103, the threshold voltage Vt of the memory cell transistors in the even columns $C_{2j}$, $C_{2j+2}$, . . . to be written first is set lower, and then the data programming procedure completes.

Figure 10:
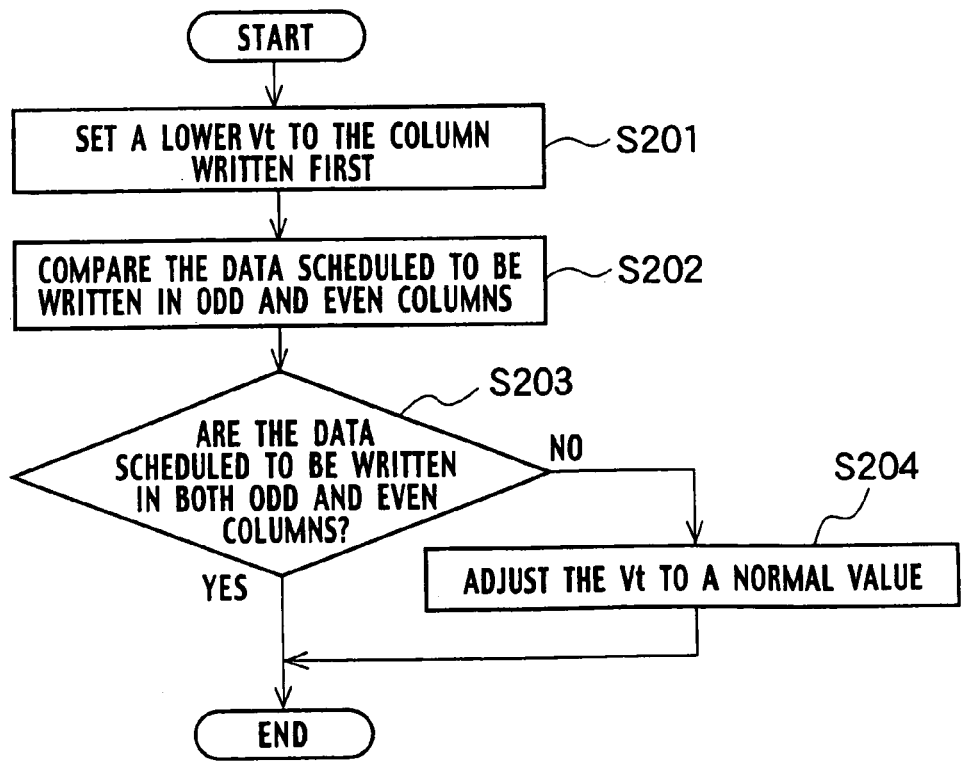
FIG. 10 is a flow chart for describing another method of setting the threshold voltage Vt for the semiconductor memory according to the first embodiment of the present invention.

1.3.2 Another Threshold Voltage Control:

Another threshold voltage control method for the data programming architecture of the semiconductor memory according to the first embodiment of the present invention is described referencing FIG. 10.

(a) In step S201, the threshold voltage Vt of the memory cell transistors in the even columns $C_{2j}$, $C_{2j+2}$, . . . to be written first is set lower;

(b) Next, in step S202, the first data for the even columns $C_{2j}$, $C_{2j+2}$, . . . latched by the first latch 12 and the second data for the odd columns $C_{2j-1}$, $C_{2j+1}$, . . . latched by the second latch 13 are compared, then the procedure proceeds to step S203;

(c) In step S203, if "1" is not determined to be latched by both the first latch 12 and the second latch 13, the procedure proceeds to step S204. If "1" is determined to be latched by both the first latch 12 and the second latch 13 in step S203, the procedure completes; and (d) In step S204, the threshold voltage Vt set lower is reset to be a normal target value, and then the data programming procedure completes.

Figure 11:
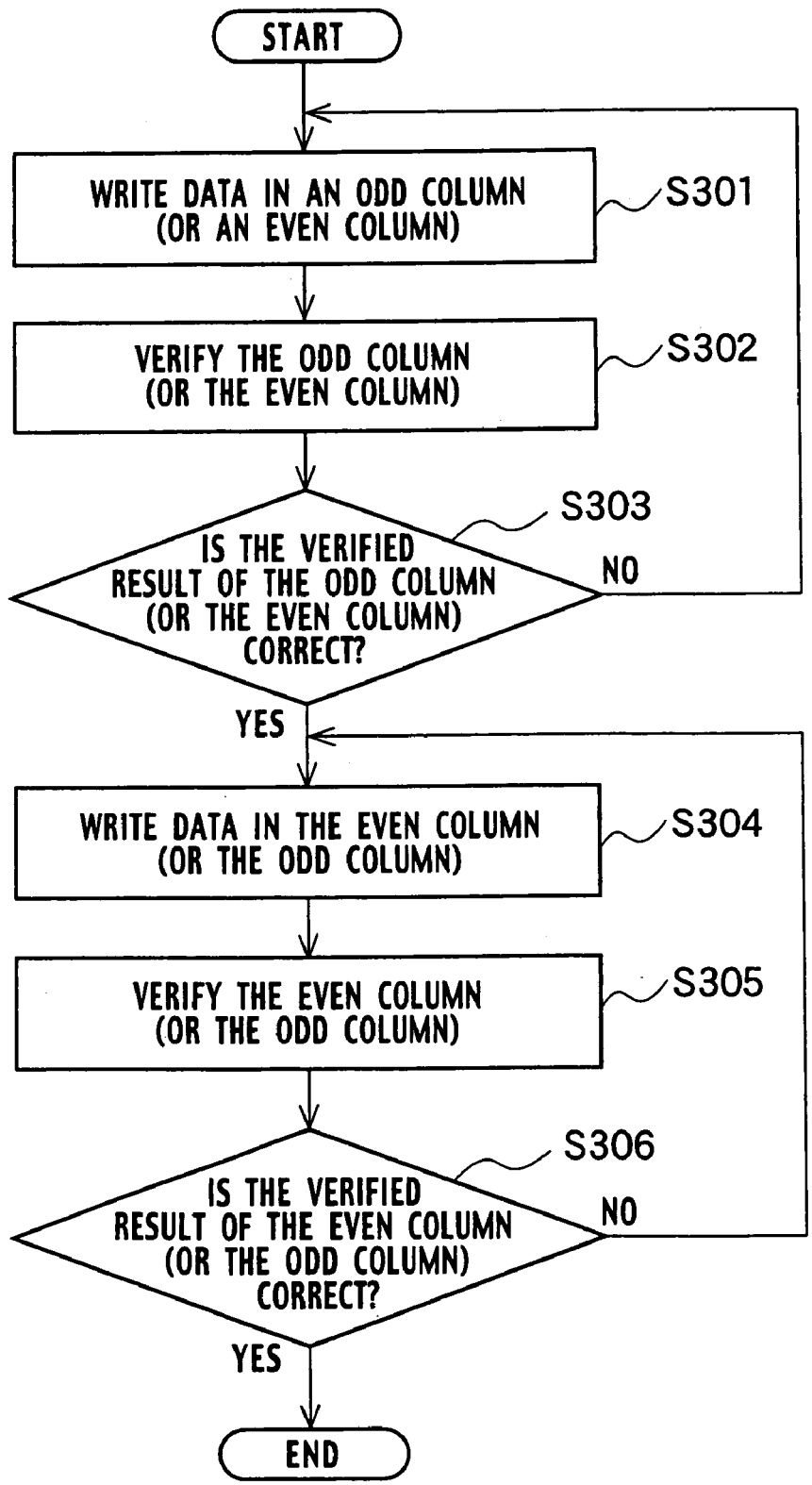
FIG. 11 is a flow chart for describing a programming method for the semiconductor memory according to the first embodiment of the present invention.

1.3.3 Programming Method:

A programming method for the semiconductor memory according to the first embodiment of the present invention is described using the flowchart shown in FIG. 11 while referencing FIGS. 7A, 7B, 8A and 8B. Here, the case of a first writing into the even columns $C_{2j}$, $C_{2j+2}$, . . . and then a second writing into the odd columns $C_{2j-1}$, $C_{2j+1}$, . . . is described as an example.

As occasion demands, the threshold voltage Vt for the verified memory cell transistors may be set to be lower than target threshold voltage of the memory cell transistors in the first cell columns (even columns) $C_{2j}$, $C_{2j+2}$, . . . as shown in FIG. 7A. The verified threshold voltage of the memory cell transistors in the first cell columns $C_{2j}$, $C_{2j+2}$, . . . is reduced by amount just corresponding to increment ΔVt of the threshold voltage induced in the memory cell transistors in the first cell columns $C_{2j}$, $C_{2j+2}$, . . . ascribable to the amount of electric charges in the memory cell transistors of the second cell columns (odd columns) $C_{2j-1}$, $C_{2j+1}$, . . . , which are subsequently programmed after the first cell columns $C_{2j}$, $C_{2j+2}$, . . . Namely, the increment ΔVt of the threshold voltage Vt is supposed to be induced by the inter-column coupling from the memory cell transistors of the adjacent odd columns $C_{2j}$, $C_{2j+1}$, . . . . The necessity and procedure for setting the threshold voltage Vt lower than the target threshold voltage of the memory cell transistors in the first cell columns $C_{2j}$, $C_{2j+2}$, . . . may be the same as the methods described with FIG. 9 and FIG. 10. A method of reducing verify-potential of the memory cell transistors in the first cell columns $C_{2j}$, $C_{2j+2}$, ..., or increasing the potential of the bit lines $BL_{2j-1}$, $BL_{2j}$, $BL_{2j+1}$, ... in order to reduce the threshold voltage Vt of the memory cell transistors in the first cell columns $C_{2j}$, $C_{2j+2}$, ... lower than the target threshold voltage of the memory cell transistors in the first cell columns $C_{2j}$, $C_{2j+2}$, ... may be employed.

(a) In step S301, first data is written into the memory cell transistors in the first cell columns (even columns) $C_{2j}$, $C_{2j+2}$, ... as shown in FIG. 7A, while keeping the threshold voltage of the memory cell transistors in the second cell columns (odd columns) $C_{2j-1}$, $C_{2j+1}$, ... negative as shown in FIG. 7B, then the procedure proceeds to step S302;

(b) In step S302, the even columns $C_{2j}$, $C_{2j+2}$, ... are verified, then the procedure proceeds to step S303;

(c) In step S303, it is determined whether or not the threshold voltage Vt of the memory cell transistors in the even columns $C_{2j}$, $C_{2j+2}$, ... has been set to the desired value, and if it is affirmative, proceeding to step S304. In step S303, if the threshold voltage Vt of the memory cell transistors in the even columns $C_{2j}$, $C_{2j+2}$, ... is determined such that it has not been set to the desired value, the procedure returns to step S301, changing the conditions and performing write-in (rewrite);

(d) In step S304, second data is written into the odd columns $C_{2j-1}$, $C_{2j+1}$, ... as shown in FIG. 8B, then the procedure proceeds to step S305. When writing the second data into the odd columns $C_{2j-1}$, ..., $C_{2j+1}$, ..., the threshold voltage Vt of the memory cell transistors in the even columns $C_{2j}$, $C_{2j+2}$, ... changes due to the inter-column coupling, becoming the target threshold voltage Vt as shown in FIG. 8A;

(e) In step S305, the odd columns $C_{2j-1}$, $C_{2j+1}$, ... are verified, then the procedure proceeds to step S306; and (f) In step S306, if the threshold voltage Vt of the memory cell transistors in the odd columns $C_{2j-1}$, $C_{2j+1}$, ... has not been set to the desired value, the procedure returns to step S304, changing the conditions and performing write-in (rewrite). During this verify operation, data is read out using shielded bit lines. In other words, during the period of reading data from the even columns $C_{2j}$, $C_{2j+2}$, ..., the bit lines $BL_{2j-1}$, $BL_{2j}$, $BL_{2j+1}$, ... of the odd columns $C_{2j-1}$, $C_{2j+1}$, ... are fixed to a predetermined voltage such as Vss (0V). On the other hand, in step S306, if the threshold voltage Vt of the memory cell transistors in the odd columns $C_{2j-1}$, $C_{2j+1}$, ... has been set to the desired value, the sequence of the process completes.

With the programming method for the semiconductor memory according to the first embodiment, erroneous programming may be prevented by controlling changes in the threshold voltage Vt due to the inter-column coupling even if the minimum line width is narrower than 100 nm.

1.4 Miscellaneous Architecture of Flash Memories:

The semiconductor memory according to the first embodiment and the programming method thereof are not limited to the description given above, and various modifications are possible. It should be noted that the first embodiment is not limited NAND architecture, and the organization of the semiconductor memory according to the first embodiment is also similarly applicable to miscellaneous architecture of the Flash memories, such as AND Flash memory or DINOR Flash memory.

Figure 12:
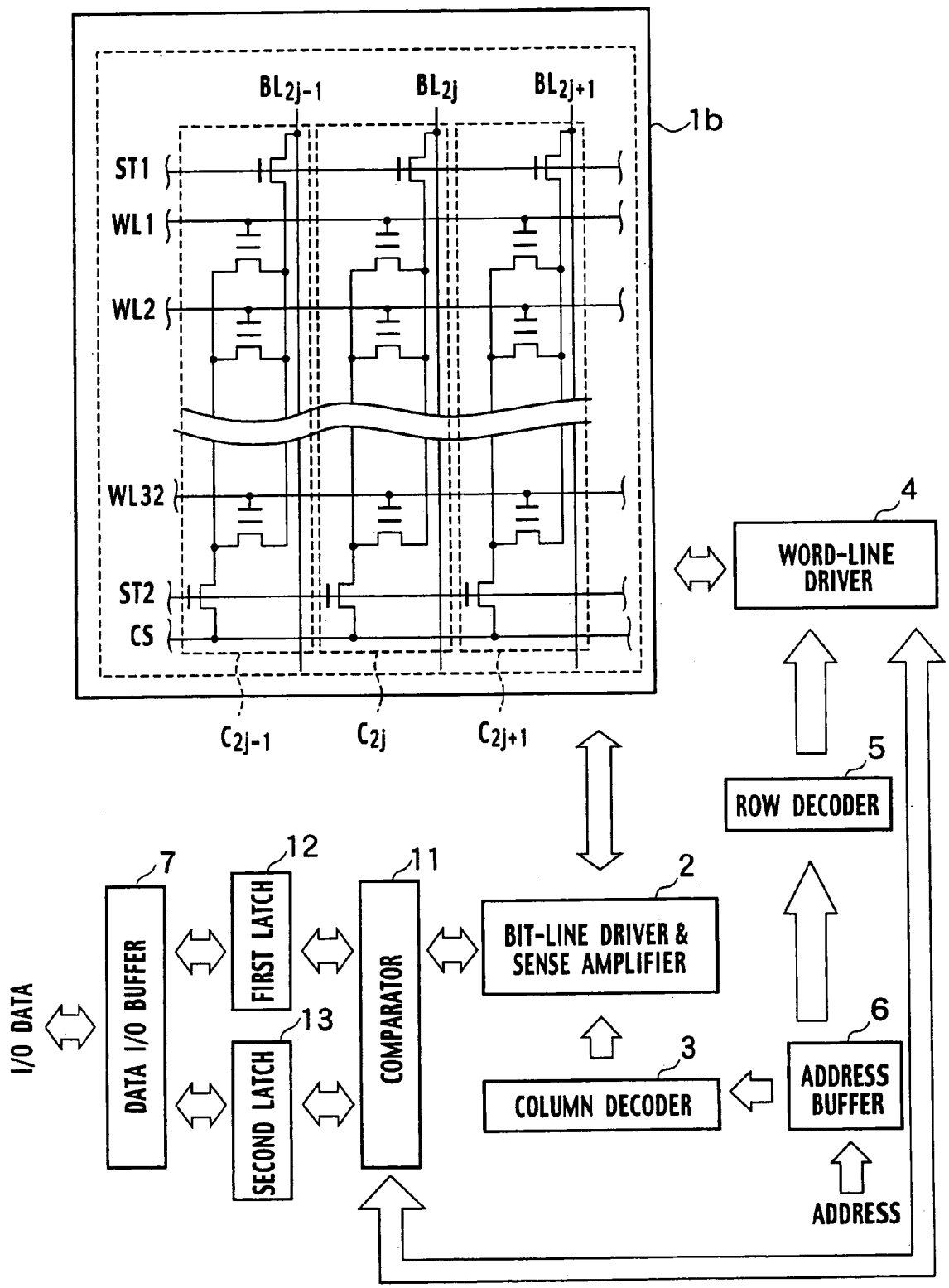
FIG. 12 is a block diagram illustrating a modified example of the semiconductor memory according to the first embodiment of the present invention.

In the AND flash memory shown in FIG. 12, memory cell transistors sharing the same gate constitute the word lines WL1, WL2, ... WL32 arranged along the horizontal direction. And memory cell transistors sharing the same drain electrode and same source electrode constitute bit lines $BL_{2j-1}$, $BL_{2j}$, $BL_{2j+1}$, ... arranged along the vertical direction, orthogonal to these word lines WL1, WL2, ... WL32. FIG. 12 illustrates the case where 32 memory cell transistors are arranged along the column-direction so as to implement each of the cell columns. Pair of select transistors, which select a group of memory cell transistors serially arranged in the cell column, are arranged at both ends of the cell column array. The plural cell columns are arranged in parallel, close to each other. Upper select gate line ST1 is connected to the respective gates of upper select transistors. Lower select gate line ST2 is connected to the respective gates of the lower select transistors.

The drain electrode of the upper select transistors are connected to the corresponding bit lines $BL_{2j-1}$, $BL_{2j}$, $BL_{2j+1}$, ... The source electrode of the upper select transistors are connected to the drain electrodes of memory cell transistors constituting the corresponding cell columns. The drain electrode of the lower select transistors are connected to the source electrodes of memory cell transistors constituting the corresponding cell columns, and the source electrode of the lower select transistors are connected to the common source line CS. As it will be appreciated, the terms drain and source can be exchanged without modifying the structure itself. The structure and materials of the memory cell transistors are similar to the structure and materials already explained in the NAND flash memory, and overlapping or redundant description may be omitted in the AND flash memory.

In miscellaneous architectures of the Flash memories, such as AND Flash memory and DINOR Flash memory, similar functions, ways and technical advantages can be achieved with the NAND architecture described above, such that erroneous programming can be prevented by controlling the threshold voltage Vt due to the inter-column coupling, even if the minimum line width of these miscellaneous architectures of the Flash memories is narrower than 100 nm, by the configuration encompassing the similar leading program circuit, the similar lagging program circuit, and the similar voltage controller, which may be implemented by similar peripheral circuits such as the first latch 12, the second latch 13, the comparator 11, the bit-line driver 2, the word-line driver 4, the column decoder 3, the word-line driver 4, the row decoder 5, and the address buffer 6 as shown in FIG. 4.

Figure 13:
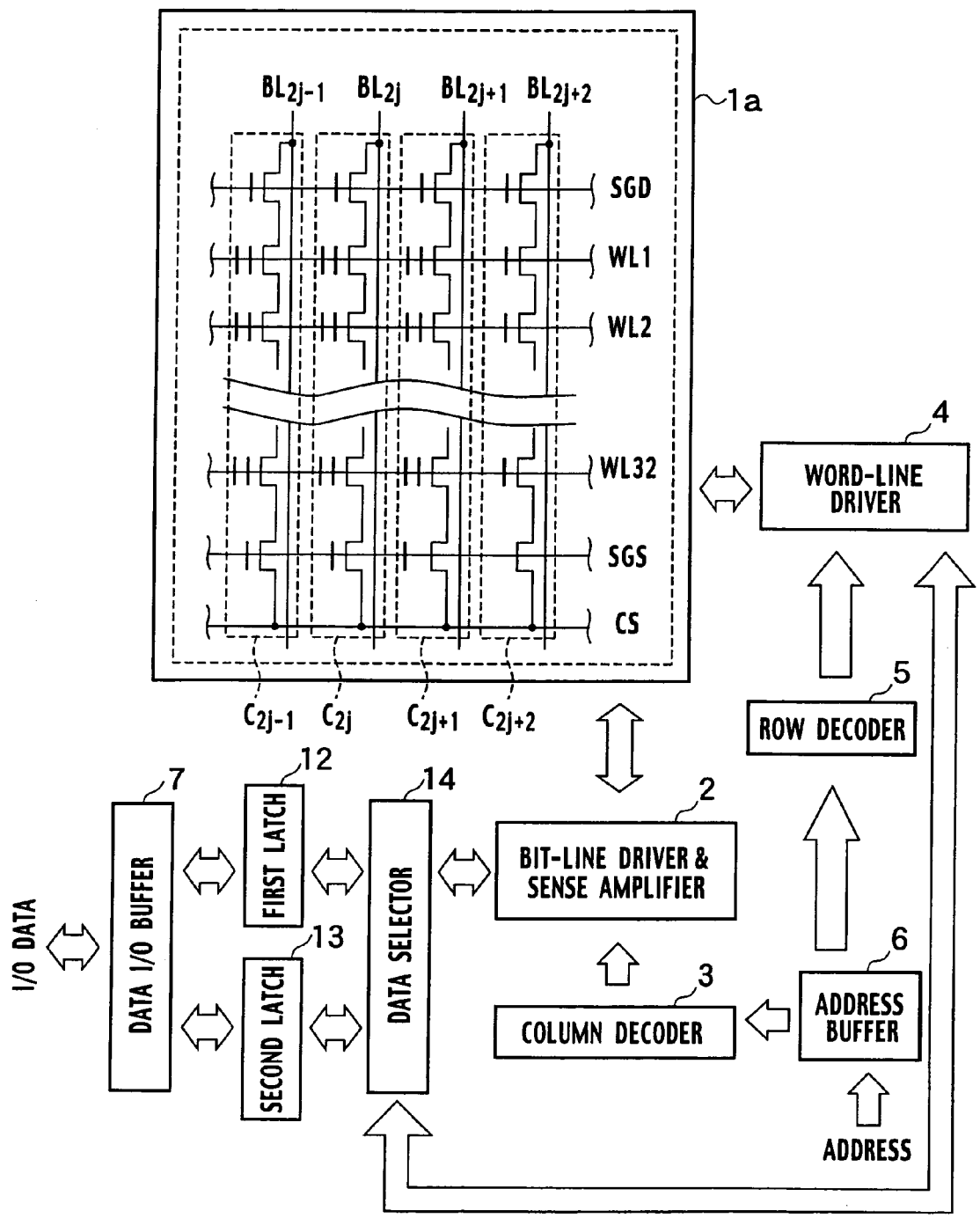
FIG. 13 is a block diagram illustrating a semiconductor memory according to the second embodiment of the present invention.

2. Second Embodiment 2.1 Memory Organization:

A semiconductor memory according to a second embodiment of the present invention, as shown in FIG. 13, encompasses a data selector 14, a first latch 12 connected to the data selector 14, a second latch 13 connected to the data selector 14, a bit-line driver 2 connected to the data selector 14 and a word-line driver 4 connected to the data selector 14. The data selector 14 selects the first latch 12 or the second latch 13, switching over programming data.

A leading program circuit, a lagging program circuit, and a voltage controller of the semiconductor memory according to the second embodiment are implemented by peripheral circuits such as the first latch 12, the second latch 13, the data selector 14, the bit-line driver 2, the word-line driver 4, the column decoder 3, the word-line driver 4, the row decoder 5, and the address buffer 6. In this case, the "leading program circuit" writes first data into respective memory cell transistors in first cell columns—for example, even columns $C_{2j}$, $C_{2j+2}$, ... as shown in FIG. 13. After the even columns $C_{2j}$, $C_{2j+2}$, ... have been written, the "lagging program circuit" writes second data into respective memory cell transistors in second cell columns—odd columns $C_{2j-1}$, $C_{2j+1}$, ..., which have an interdigital arrangement with (alternate-finger manner) the first cell columns $C_{2j}$, $C_{2j+2}$, .... In addition, the "voltage controller" controls the variation of the threshold voltages Vts for the memory cell transistors belonging to the first cell columns, or the even columns $C_{2j}$, $C_{2j+2}$, ... ascribable to the amount of electric charges in the memory cell transistors belonging to the second cell columns, or the odd columns $C_{2j-1}$, $C_{2j+1}$, .... Other feature is basically same as the organization of the semiconductor memory according to the first embodiment, and thus duplicate descriptions are omitted.

All of the peripheral circuits such as the first latch 12, the second latch 13, the data selector 14, the bit-line driver 2, the word-line driver 4, the column decoder 3, the word-line driver 4, the row decoder 5, and the address buffer 6 shown in FIG. 4 may be monolithically integrated onto the same semiconductor chip as the memory cell matrix 1a; alternatively it may be a configuration of a hybrid integrated circuit, where some of the first latch 12, the second latch 13, the data selector 14, the bit-line driver 2, the word-line driver 4, the column decoder 3, the word-line driver 4, the row decoder 5, and the address buffer 6 are integrated onto a different semiconductor chip.

With the semiconductor memory according to the second embodiment, erroneous programming may be prevented by controlling changes in the threshold voltage Vt due to the inter-column coupling even if the minimum line width is narrower than 100 nm.

Figure 14:
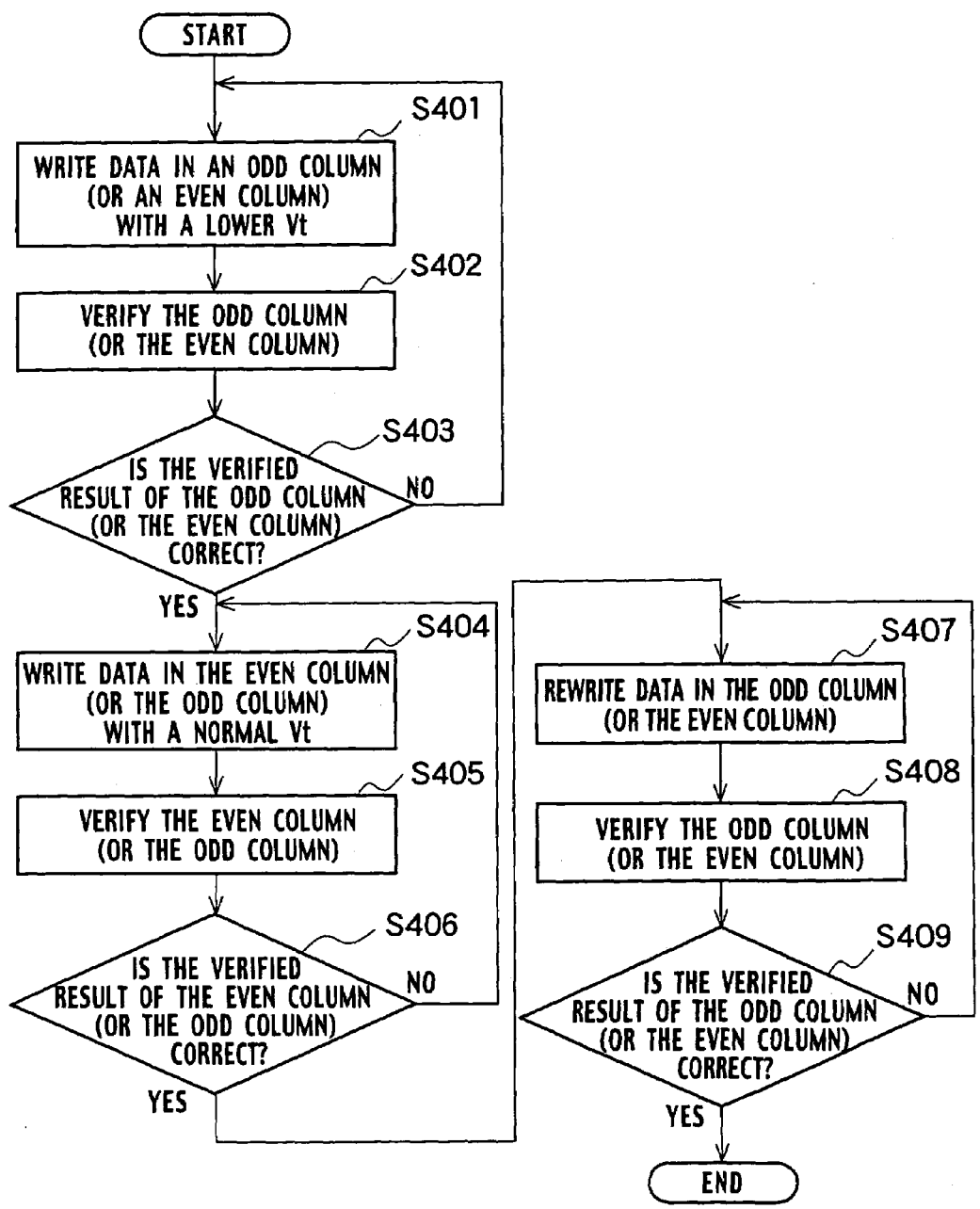
FIG. 14 is a flow chart for describing a programming method for the semiconductor memory according to the second embodiment of the present invention.

2.2 VT Controlled Programming Method:

A programming method of the semiconductor memory according to the second embodiment of the present invention is described referencing FIG. 14. In FIG. 14, it is assumed that the even columns $C_{2j}$, $C_{2j+2}$, ... are the first cell columns, where first data for the even columns $C_{2j}$, $C_{2j+2}$, ... is latched by the first latch 12, and the odd columns $C_{2j-1}$, $C_{2j+1}$, ... are the second cell columns, where second data for the odd columns $C_{2j-1}$, $C_{2j+1}$, ... is latched by the second latch 13.

(a) In step S401, under the condition such that the threshold voltage Vt is set to be lower than the target threshold voltage of the memory cell transistors in the even columns $C_{2j}$, $C_{2j+2}$, ..., the even columns $C_{2j}$, $C_{2j+2}$, ... are written with first data, and then the procedure proceeds to step S402. The even columns $C_{2j}$, $C_{2j+2}$, ... are verified in step S402, then the procedure proceeds to step S403;

(b) In step S403, if it has been determined that the threshold voltage Vt of the memory cell transistors in the even columns $C_{2j}$, $C_{2j+2}$, ... has not been set to the desired value, the procedure returns to step S401, once again changing the conditions and performing write-in. If it is determined in step S403 that the threshold voltage Vt for of the memory cell transistors in the even columns $C_{2j}$, $C_{2j+2}$, ... has been set to the desired value, the procedure proceeds to step S404;

(c) In step S404, second data is written into the odd columns $C_{2j-1}$, $C_{2j+1}$, ..., under the condition such that the threshold voltage Vt is set as the normal target threshold voltage Vt, then the procedure proceeds to step S405. In step S405, the odd columns $C_{2j-1}$, $C_{2j+1}$, ... are verified, then the procedure proceeds to step S406;

(d) In step S406, if it is determined that the threshold voltage Vt of the memory cell transistors in the odd columns $C_{2j-1}$, $C_{2j+1}$, ... has not been set to the desired value, the procedure returns to step S404, once again changing the conditions and performing write-in. If it is determined in step S406 that the threshold voltage Vt of the memory cell transistors in the odd columns $C_{2j-1}$, $C_{2j+1}$, ... has been set to the desired value, the procedure proceeds to step S407;

(e) The even columns $C_{2j}$, $C_{2j+2}$, ... are re-written in step S407, then the procedure proceeds to step S408. The even columns $C_{2j}$, $C_{2j+2}$, ... are verified in step S408, then the procedure proceeds to step S409; and (f) In step S409, if it is determined that the threshold voltage Vt of the memory cell transistors in the even columns $C_{2j}$, $C_{2j+2}$, ... has not been set to the desired value, the procedure returns to step S401, once again changing the conditions and performing write-in. If it is determined in step S409 that the threshold voltage Vt of the memory cell transistors in the even columns $C_{2j}$, $C_{2j+2}$, ... has been set to the desired value, the procedure completes.

The programming method of the semiconductor memory according to the second embodiment uses the data selector 14 shown in FIG. 13 for switching over programming data.

With the semiconductor memory according to the second embodiment of the present invention, program time and verify time can be shortened since the re-write operation in even columns $C_{2j}$, $C_{2j+2}$, ... is executed after the inter-column coupling has been generated. In addition, since the even columns $C_{2j}$, $C_{2j+2}$, ... and the odd columns $C_{2j-1}$, $C_{2j+1}$, ... are latched by the first latch 12 and the second latch 13, respectively, contents of the latches do not need to be initially erased.

The semiconductor memory according to the second embodiment and the programming method thereof are not limited to the description given above, and various modifications are possible. The case of programming and verifying starting with the even columns $C_{2j}$, $C_{2j+2}$, ... has been described in the above description, for example; however, reversing the order and assigning the odd columns $C_{2j-1}$, $C_{2j+1}$, ... as the first cell columns is of course possible.

2.3 Miscellaneous Architecture of Flash Memories:

The semiconductor memory according to the second embodiment is not limited NAND architecture, and the organization of the semiconductor memory according to the second embodiment is also similarly applicable to miscellaneous architecture of the Flash memories, such as AND Flash memory or DINOR Flash memory. In these miscellaneous architectures of the Flash memories, similar functions, ways and technical advantages can be achieved with the NAND architecture described above, such that erroneous programming can be prevented by controlling the threshold voltage Vt due to the inter-column coupling, even if the minimum line width of these miscellaneous architectures of the Flash memories is narrower than 100 nm, by the configuration encompassing the similar leading program circuit, the similar lagging program circuit, and the similar voltage controller, which may be implemented by similar peripheral circuits such as the first latch 12, the second latch 13, the data selector 14, the bit-line driver 2, the word-line driver 4, the column decoder 3, the word-line driver 4, the row decoder 5, and the address buffer 6 as shown in FIG. 13.

3. Third Embodiment

Figure 15:
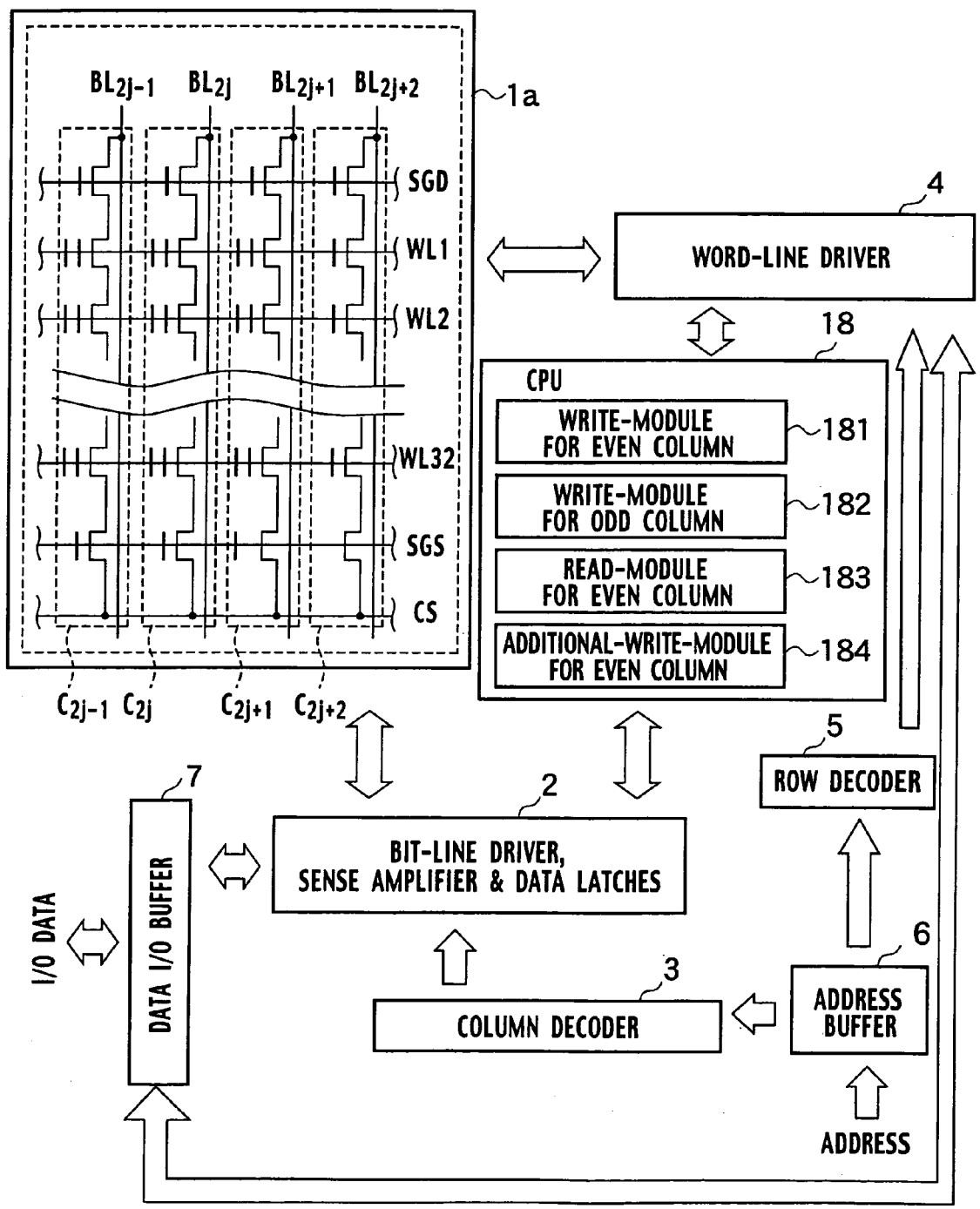
FIG. 15 is a block diagram illustrating a semiconductor memory according to the third embodiment of the present invention.

3.1 Memory Organization:

A semiconductor memory according to a third embodiment of the present invention, as shown in FIG. 15, encompasses a data input/output buffer 7 connected to the bit-line driver 2 and the word-line driver 4, and further, a CPU 18 also connected to the bit-line driver 2 and the word-line driver 4. Furthermore, the bit-line driver 2 includes a sense amplifier and a data latch.

The data latch included in the bit-line driver 2, differs from the semiconductor memories according to the first and second embodiments (see FIGS. 4, 12 and 13) in that it latches data common for first and second cell columns, without distinguishing data between for the odd columns $C_{2j-1}$, $C_{2j+1}$, . . . and for the even columns $C_{2j}$, $C_{2j+2}$, . . . .

Figure 16A:
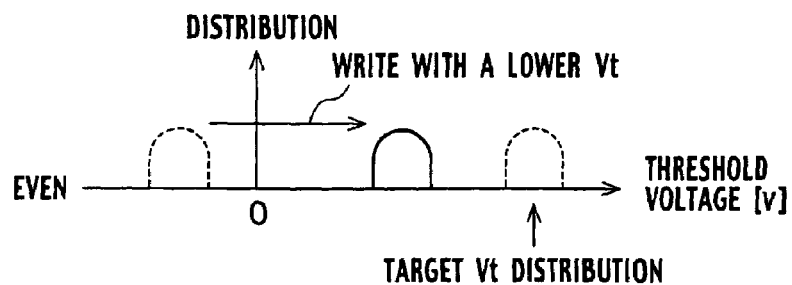
FIG. 16A is a schematic diagram illustrating a threshold voltage distribution due to a program operation into a even column in the semiconductor memory according to the third embodiment of the present invention.
Figure 17A:
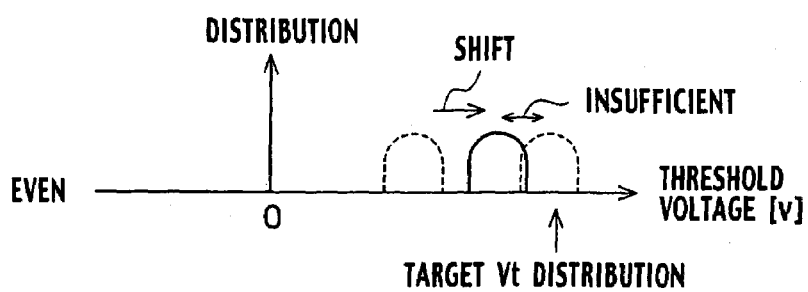
FIG. 17A illustrates a shift in the threshold voltage distribution in the even column from the state shown in FIG. 16A, due to a program operation into the odd column shown in FIG. 17B, showing the threshold voltage distribution is insufficient for the target threshold voltage.
Figure 17B:
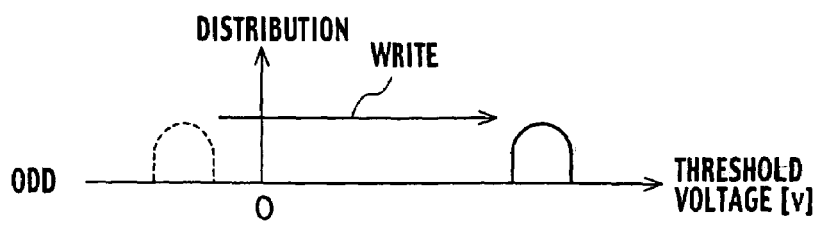
FIG. 17B illustrates a change in the threshold voltage distribution in the odd column from the state shown in FIG. 16B, due to the program operation into the odd column, which is executed after the program operation into the even column shown in FIG. 16A.
Figure 18A:
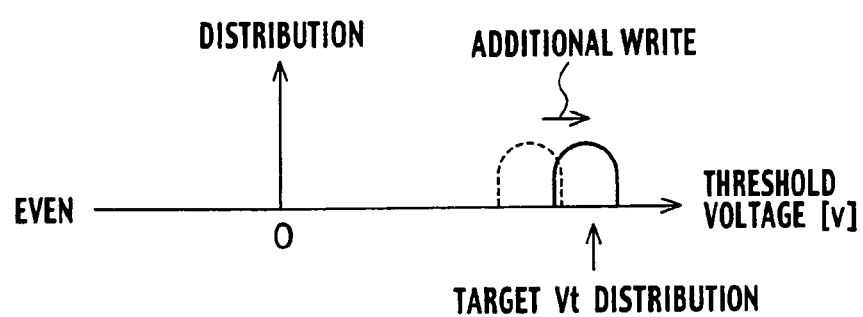
FIG. 18A illustrates a shift in the threshold voltage distribution in the even column from the state shown in FIG. 17A, due to an additional write operation into the even column.
Figure 18B:
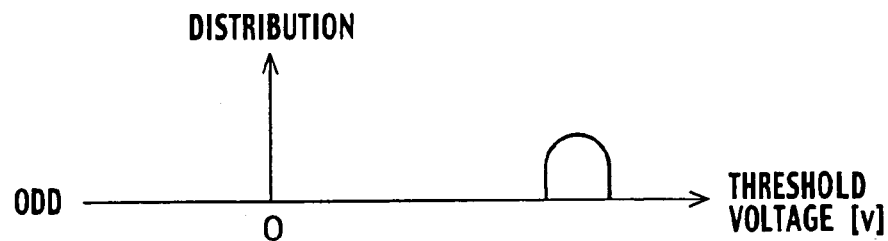
FIG. 18B illustrates the threshold voltage distribution in the odd column, during the additional write operation into the even column shown in FIG. 18A.

Furthermore, the semiconductor memory according to the third embodiment includes the CPU 18 for controlling the bit-line driver 2 and the word-line driver 4. This CPU 18 embraces an even-column writing module 181, an odd-column writing module 182, an even-column reading module 183, and an even-column additional writing module 184. The even-column writing module 181, as shown in FIG. 16A, is a logic circuit configured to first write data at a lower level by setting the threshold voltage Vt to be lower than the target threshold voltage distribution. The odd-column writing module 182, as shown in FIG. 17B, is a logic circuit configured to write second data into the odd columns $C_{2j-1}$, $C_{2j+1}$, . . . with a setting for a normal target threshold voltage Vt. The even-column reading module 183 is a logic circuit that reads the first data (threshold voltage Vt) from the even columns $C_{2j}$, $C_{2j+2}$, . . . that are once written, and determines whether or not the threshold voltage Vt of the memory cell transistors in the even columns $C_{2j}$, $C_{2j+2}$, . . . is the desired value. The even-column additional writing module 184 is a logic circuit that, as shown in FIG. 18A, additionally writes into the even columns $C_{2j}$, $C_{2j+2}$, . . . such that it becomes the target threshold voltage Vt when the even column reading module 183 has determined that the threshold voltage Vt of the memory cell transistors in the even columns $C_{2j}$, $C_{2j+2}$, . . . does not meet the desired value. These even-column writing module 181, odd-column writing module 182, even-column reading module 183, and even-column additional writing module 184 may be implemented by software programs. Using the software programs implementing the above functions, the programming method illustrated in the flowchart of FIG. 19 may be executed by controlling the bit-line driver 2 and the word-line driver 4. Otherwise, it basically has the same organization as the semiconductor memory according to the first and second embodiments, and thus duplicate descriptions are omitted.

With the semiconductor memory according to the third embodiment, erroneous programming may be prevented by controlling changes in the threshold voltage Vt due to the inter-column coupling even if the minimum line width is narrower than 100 nm.

Figure 19:
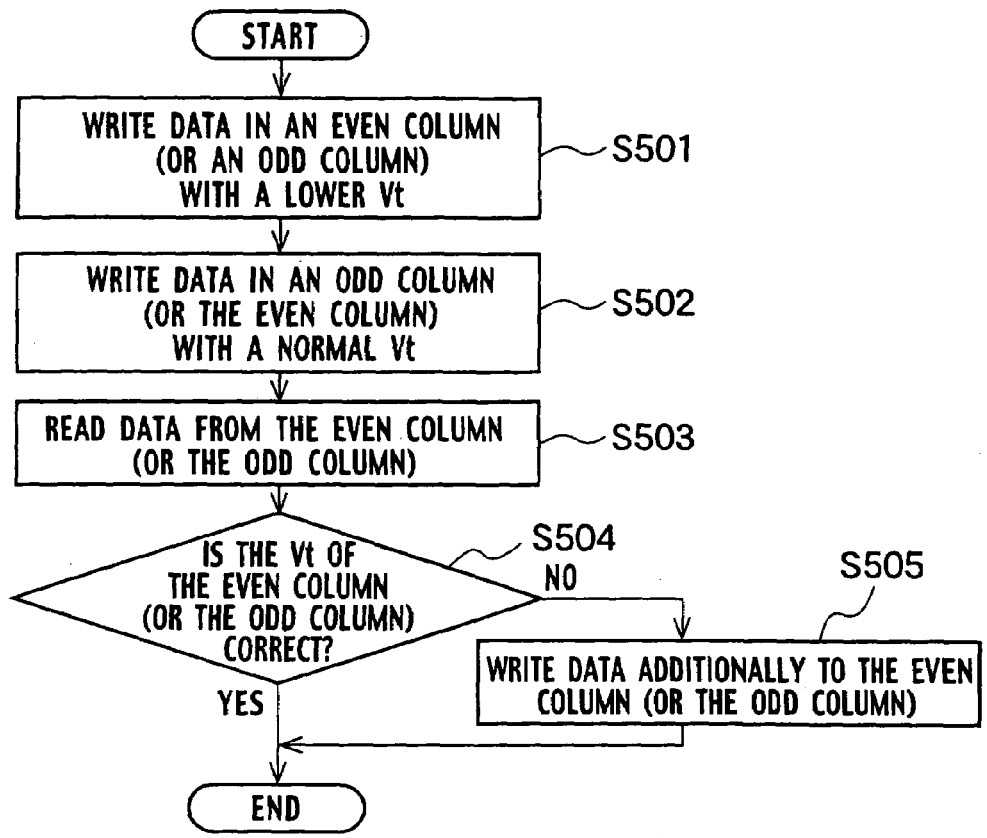
FIG. 19 is a flow chart for describing a programming method for the semiconductor memory according to the third embodiment of the present invention.

3.2 VT Controlled Programming Method:

A programming method for the semiconductor memory according to the third embodiment of the present invention, in the case where first data is first written into the even columns $C_{2j}$, $C_{2j+2}$, . . . , which serve as the first cell columns, is described using the flowchart shown in FIG. 19, while referencing FIGS. 16A, 16B, 17A, 17B, 18A and 18B.

Figure 16B:
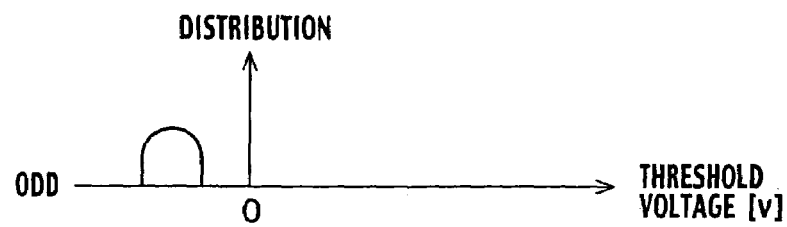
FIG. 16B is a schematic diagram illustrating threshold voltage distributions in a odd column associated with a program operation into the even column shown in FIG. 16A.

(a) In step S501, first data is written into the even columns $C_{2j}$, $C_{2j+2}$, . . . , or the first cell columns as shown in FIG. 16A, while keeping the threshold voltage of the memory cell transistors in the second cell columns (odd columns) $C_{2j-1}$, $C_{2j+1}$, . . . negative as shown in FIG. 16B. At this time, as shown in FIG. 16A, the threshold voltage Vt is set to be lower than the target threshold voltage distribution, the first data is written at a lower level, and then the procedure proceeds to step S502;

(b) Next, in step S502, second data is written into the odd columns $C_{2j-1}$, $C_{2j+1}$, . . . as shown in FIG. 17B, under the condition such that the threshold voltage Vt is set as the normal target threshold voltage Vt, and then the procedure proceeds to step S503. When the second data is written into the odd columns $C_{2j-1}$, $C_{2j+1}$, . . . with the condition such that the threshold voltage Vt is set as the normal target threshold voltage Vt, the threshold voltage Vt of the memory cell transistors in the even columns $C_{2j}$, $C_{2j+2}$, . . . increases due to the inter-column coupling as shown in FIG. 17A;

(c) Next, in step S503, the data (threshold voltage Vt) for the even columns $C_{2j}$, $C_{2j+2}$, . . . is read out, and then the procedure proceeds to step S504. In step S504, as shown in FIG. 17A, if it is determined that the threshold voltage Vt of the memory cell transistors in the even columns $C_{2j}$, $C_{2j+2}$, . . . does not meet the desired value, the procedure proceeds to step S505. In step S504, if the threshold voltage Vt of the memory cell transistors in the even columns $C_{2j}$, $C_{2j+2}$, . . . has reached the desired value due to the inter-column coupling, additional writing is not necessary, and the procedure completes; and (d) When the procedure has proceeded to step S505, additional write-in is performed for the even columns $C_{2j}$, $C_{2j+2}$, . . . such that the threshold voltage Vt can reach the target value, as shown in FIG. 18A. In step S409, if the threshold voltage Vt of the memory cell transistors in the even columns $C_{2j}$, $C_{2j+2}$, . . . has been set to the desired value, the procedure completes.

With the programming method for the semiconductor memory according to the third embodiment, erroneous programming may be prevented by controlling changes in the threshold voltage Vt due to the inter-column coupling even if the minimum line width is narrower than 100 nm.

The semiconductor memory according to the third embodiment and the programming method thereof are not limited to the description given above, and various modifications are possible. The case of programming and verifying starting with the even columns $C_{2j}$, $C_{2j+2}$, . . . has been described in the above description, for example; however, reversing the order and making the odd columns $C_{2j}$, $C_{2j+1}$, . . . the first cell columns is of course possible. In this case, in FIG. 15, the CPU 18 may naturally have an organization where the even columns and the odd columns are interchanged so as to include an odd-column writing module 181, an even-column writing module 182, an odd-column reading module 183, and an odd-column additional writing module 184.

3.3 Miscellaneous Architecture of Flash Memories:

The semiconductor memory according to the third embodiment is not limited NAND architecture, and the organization of the semiconductor memory according to the third embodiment is also similarly applicable to miscellaneous architecture of the Flash memories. In these miscellaneous architectures of the Flash memories, similar functions, ways and technical advantages can be achieved with the NAND architecture described above, such that erroneous programming can be prevented by controlling the threshold voltage Vt due to the inter-column coupling, even if the minimum line width of these miscellaneous architectures of the Flash memories is narrower than 100 nm, by the similar configuration encompassing the CPU 18, which embraces the even-column writing module 181, the odd-column writing module 182, the even-column reading module 183, and the even-column additional writing module 184 as shown in FIG. 15.

4. Other Embodiments

Various modifications will become possible for those skilled in the art after receiving the teaching of the present disclosure without departing from the scope thereof.

4.1 Multilevel Flash Memories

For example, bilevel Flash memories have been described in the description of the first and second embodiments of the present invention. However, the present invention is also applicable to multilevel (ML) Flash memories with triple level or more. If it is four-level Flash memory, four latches can implement the organization of the present invention. For example, if the first latch 12 and the second latch 13, shown in FIG. 12 and FIG. 13, are configured such that they can store information of two pages, respectively, the storage of information of four pages can be achieved.

In addition, even in the third embodiment, the present invention is applicable to n-level Flash memory ($n \geq 3$) by developing the organization or function of the CPU 18. A software program may change and develop of the function of the CPU 18.

4.2 Application to a Memory Card

Figure 20:
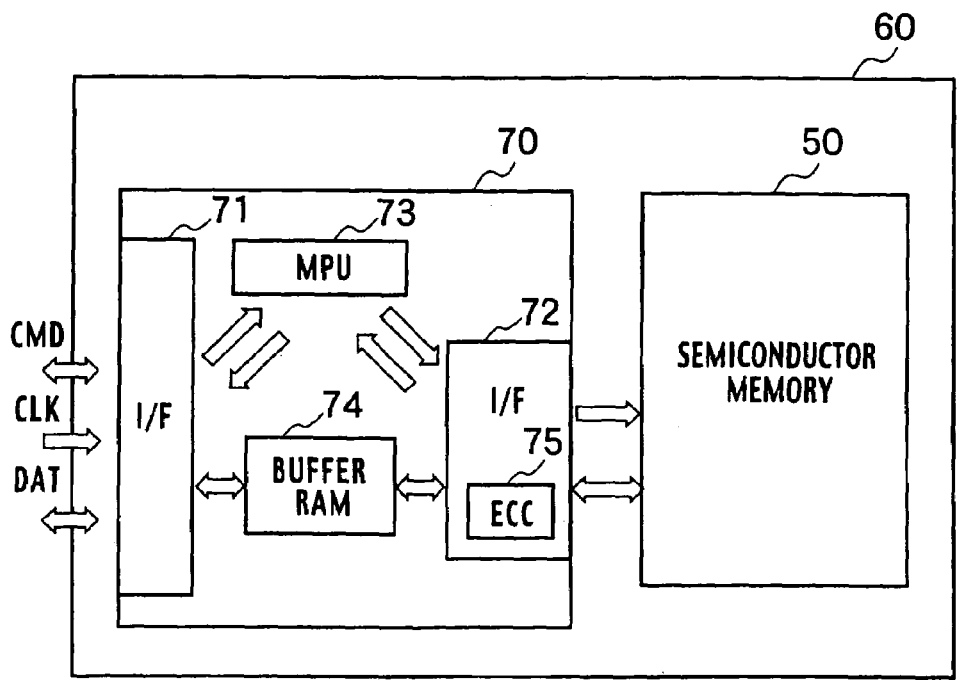
FIG. 20 is a block diagram showing the internal configuration of a memory card using the semiconductor memory according to the first through third embodiments of the present invention.

Furthermore, the semiconductor memories described in the first through third embodiments of the present invention can be applied to a memory card 60 as shown in FIG. 20. In other words, the semiconductor memories according to the first through third embodiments can serve as a semiconductor memory 50 shown in FIG. 20. In addition to the semiconductor memory 50, it further includes a controller 70, which controls the semiconductor memory 50 and receives/transmits a predetermined signal from/to an external device. The controller 70 has interface units (I/F) 71 and 72, a microprocessor unit (MPU) 73, buffer RAM 74, and an error correction code unit (ECC) 75 included in the I/F 72. The I/F 71 receives/transmits a predetermined signal from/to an external device, and the I/F 72 receives/transmits a predetermined signal from/to the semiconductor memory 50. The MPU 73 converts a logical address into a physical address. The buffer RAM 74 temporarily stores data. The ECC 75 generates an error correction code.

A command signal line CMD, a clock signal line CLK, and a signal line DAT are connected to the memory card 60. The number of control signal lines, bit width of the signal line DAT, and circuitry of the controller 76 may be modified if needed.

The semiconductor memory 50 may have a system LSI configuration, monolithically integrating, on a same semiconductor chip, the memory cell matrix 1a, the first latch 12, the second latch 13, the comparator 11, the data selector 14, the bit-line driver 2, the word-line driver 4, the column decoder 3, the row decoder 5, and the address buffer 6 and the like, as shown in FIG. 4 and FIG. 13. Alternatively, part of the circuitry shown in FIG. 4 and FIG. 13, such as the first latch 12, the second latch 13, the comparator 11 and the data selector 14 may be merged in a semiconductor chip for the controller 70.

Figure 21:
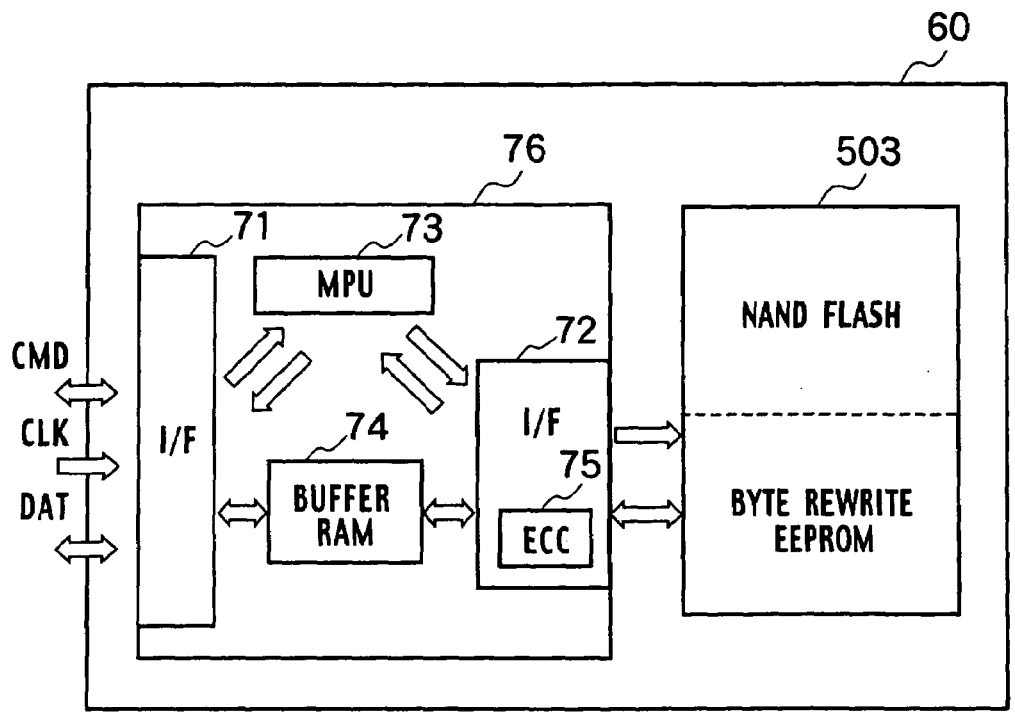
FIG. 21 is a block diagram showing the internal configuration of a memory card using the semiconductor memory according to the first through third embodiments of the present invention.

Alternatively, as shown in FIG. 21, a ROM region included EEPROM-based Flash memory 503, which is implemented by a NAND Flash memory and a byte EEPROM, may be utilized instead of the semiconductor memory 50 shown in FIG. 20. It is possible to implement the system LSI chip by merging the ROM region included EEPROM-based Flash memory 503 in the same chip as the controller 76 and integrating them onto a single semiconductor chip. In addition, it is possible to organize a memory mixed MPU by forming a semiconductor memory region implemented by the ROM region included EEPROM-based Flash memory 503 in the MPU 73, and to build a single semiconductor chip or the system LSI chip by integrating all of the interface units (I/F) 71 and 72 and buffer RAM 74. In other words, Flash memory 503 may have a system LSI configuration monolithically integrating on the same chip as the memory cell matrix 1a, the first latch 12, the second latch 13, the comparator 11, the data selector 14, the bit-line driver 2, the word-line driver 4, the column decoder 3, the row decoder 5, and the address buffer 6 and the like shown in FIG. 4 and FIG. 13. Alternatively, part of the circuitry shown in FIG. 4 and FIG. 13, such as the first latch 12, the second latch 13, and the comparator 11 may be merged in the semiconductor chip of the controller 76.

Figure 22:
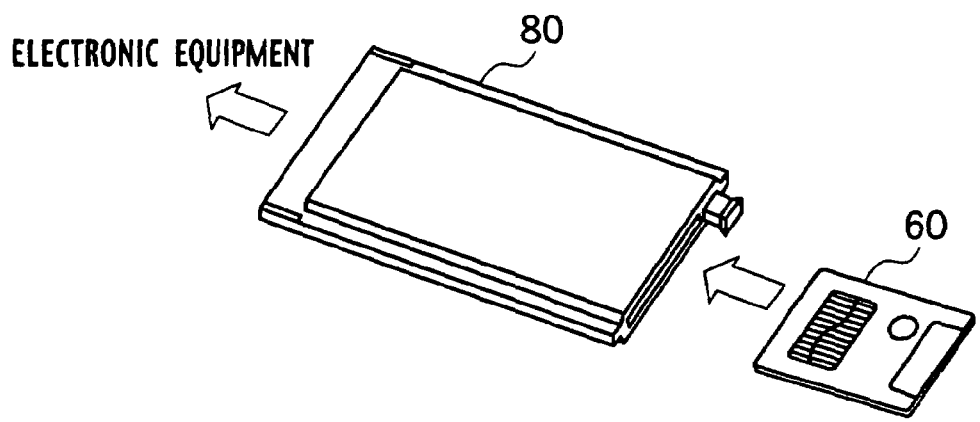
FIG. 22 is a schematic block diagram of a memory card and a cardholder using the semiconductor memory according to the first through third embodiments of the present invention.

The memory card 60 shown in FIG. 20 and FIG. 21 can organize a system combined with a memory cardholder 80 shown in FIG. 22. The memory cardholder 80 is connected to an electronic device (not shown in the drawing), and is operable as an interface between the memory card 60 and the electronic device. The memory cardholder 80 is capable of executing various functions including such as those of the controller 76, MPU 73, buffer RAM 74, ECC 75, I/F 71 and I/F 72 in the memory card 60 disclosed in FIG. 20 and FIG. 21.

4.3 Application to an IC Card

Figure 23:
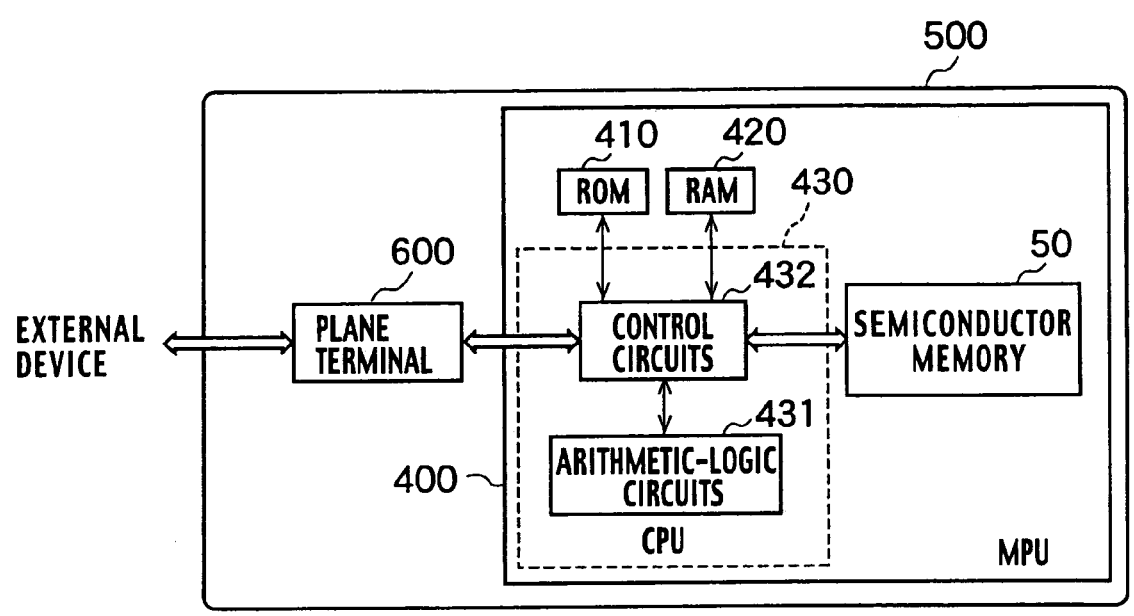
FIG. 23 is a block diagram showing the internal configuration of an IC card using the semiconductor memory according to the first through third embodiments of the present invention.

Furthermore, if the semiconductor memories according to the first through third embodiments of the present invention are applied to the semiconductor memory 50 shown in FIG. 23, it is possible to organize an IC card 500, which includes an MPU 400 and a plane terminal 600. The MPU 400 is implemented by the semiconductor memory 50, ROM 410, RAM 420 and a CPU 430. The IC card 500 can be connected to an external device via the plane terminal 600. In addition, the plane terminal 600 is coupled to the MPU 400 in the IC card 500. The CPU 430 includes a calculation section 431 and a control section 432. The control section 432 is coupled to the semiconductor memory 50, ROM 410, and RAM 420. It is desirable that the MPU 400 is mounted on one of the surfaces of the IC card 500, and the plane terminal 600 is mounted on the other surface of the IC card 500. In addition, it may be fabricated to a single semiconductor chip, such as a system LSI chip, monolithically integrating all of ROM 410, RAM 420, the CPU 430, and the semiconductor memory region, and further the first latch 12, the second latch 13, the comparator 11, the data selector 14, the bit-line driver 2, the word-line driver 4, the column decoder 3, the row decoder 5, and the address buffer 6 and the like, which are shown in FIG. 4 and FIG. 13. Furthermore, it may have the structure of ROM region included EEPROM-based Flash memory with an embedded ROM 410 in the semiconductor memory region, and build a single semiconductor chip or a system LSI chip, integrating this entire ROM region included EEPROM

4.4 Application to a USB Flash Device

Figure 24:
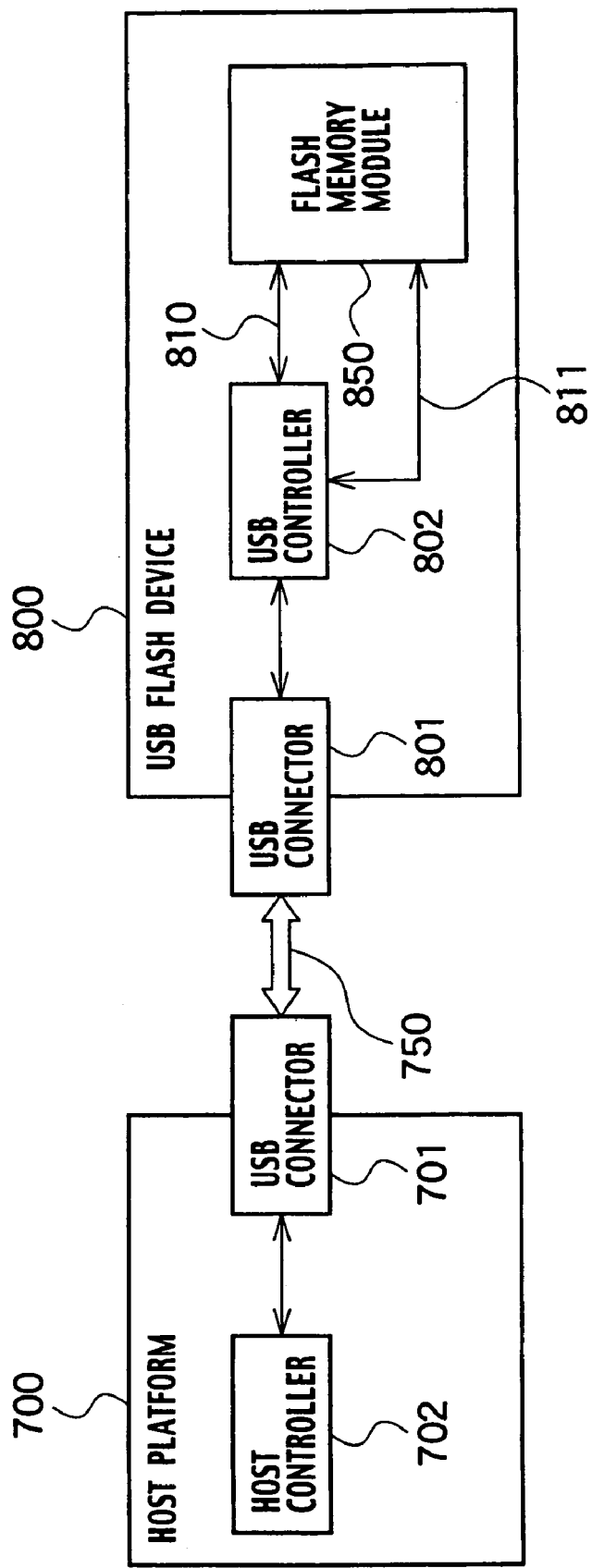
FIG. 24 is a block diagram showing the configuration of a Flash memory system using the semiconductor memory according to the first through third embodiments of the present invention.

Furthermore, the nonvolatile semiconductor memories explained in the first to the third embodiment of the present invention are applicable to a universal serial bus (referred to as "USB" hereafter) Flash device 800 as shown in FIG. 24. A host platform 700 and the USB Flash device 800 implement the Flash memory system shown in FIG. 24. The host platform 700 is connected to the USB Flash device 800 via a USB cable 750. The host platform 700 is connected to the USB cable 750 via a USB connector 701, and the USB Flash device 800 is connected to the USB cable 750 via a USB connector 801. The host platform 700 has a USB host controller 702, which controls packet transmission through a USB bus. The USB Flash device 800 encompasses a USB controller 802, which controls other elements in the USB Flash device 800 as well as controls the interface with the USB bus for the USB Flash device 800; the USB connector 801; and a Flash memory module 850, which is implemented by at least one semiconductor memory described in the first to third embodiments of the present invention.

When the USB Flash device 800 is connected to the host platform 700, standard USB enumeration processing begins. In this processing, the host platform 700 recognizes the USB Flash device 800, selects a mode for transmission therewith, and performs reception/transmission of data from/to the USB Flash device 800 via a FIFO buffer called an end point, which stores transfer data. The host platform 700 recognizes changes in the physical and electrical states such as removal/attachment of the USB Flash device 800 via another end point, and receives any existing to-be-received packets. The host platform 700 requests services from the USB Flash device 800 by sending a request packet to the USB host controller 702. The USB host controller 702 transmits the packet to the USB cable 750. If the USB Flash device 800 is the unit with the end point that has received this request packet, the USB controller 802 accepts this request.

Next, the USB controller 802 performs various operations such as read-out, write-in or erase of data from or to the Flash memory module 850. In addition, it supports basic USB functions such as acquiring a USB address and the like. The USB controller 802 controls the Flash memory module 850 via either a control line 810, which is used to control output from the Flash memory module 850, or, for example, other various signals such as /CE, a read-out signal or a write-in signal. Furthermore, the Flash memory module 850 is also connected to the USB controller 802 via an address data bus 811. The address data bus 811 transfers read-out, write-in or erase commands for the Flash memory module 850, and the address and data for the Flash memory module 850.

In order to notify the host platform 700 of the result and status of the various operations requested by the host platform 700, the USB Flash device 800 transmits a status packet using a status end point (end point 0). In this processing, the host platform 700 checks (polls) for the existence of a status packet, and the USB Flash device 800 returns an empty packet or a status packet in the case where there is no packet for a new status message. As described thus far, applying the Flash memory module 850, which is implemented by at least one semiconductor memory described in the first to third embodiments of the present invention, allows implementation of various functions of the USB Flash unit. Directly connecting the connectors is also possible, by omitting the USB cable described above.

Thus, the present invention of course includes various embodiments and modifications and the like, which are not detailed above. Therefore, the scope of the present invention will be defined in the following claims.

What is claimed is:

1. A programming method of semiconductor memory having a memory cell matrix including a plurality of first and second cell columns alternately arranged along a row-direction, each of cell columns is implemented by a plurality of memory cell transistors serially connected along a column-direction and a select transistor configured to select the memory cell transistors, and peripheral circuits configured to drive the memory cell matrix and to read information from the memory cell matrix, the peripheral circuit, the programming method comprising:

latching first data configured to be written into memory cell transistors in the first cell columns;

latching second data configured to be written into memory cell transistors in the second cell columns after the first data are written into the memory cell transistors in the first cell columns;

comparing the first data with the second data so as to determine shift of threshold voltages of memory cell transistors in the first cell columns, which are estimated to be induced by electric charges written in the memory cell transistors of the second cell columns;

writing electric charges into memory cell transistors in the first cell columns, which correspond to the determined shift of threshold voltages; and writing second data into memory cell transistors in the second cell columns after the first data are written into the memory cell transistors in the first cell columns.

2. A programming method of semiconductor memory having a memory cell matrix including a plurality of first and second cell columns alternately arranged along a row-direction, each of cell columns is implemented by a plurality of memory cell transistors serially connected along a column-direction and a select transistor configured to select the memory cell transistors, and peripheral circuits configured to drive the memory cell matrix and to read information from the memory cell matrix, the peripheral circuit, the programming method comprising:

writing first data into memory cell transistors in the first cell columns with initial electric charges, which is smaller than the amount required to achieve target threshold voltage of memory cell transistors in the first cell columns;

writing second data into memory cell transistors in the second cell columns after the first data are written into the memory cell transistors in the first cell columns;

measuring shifted threshold voltages of memory cell transistors in the first cell columns, which are induced by electric charges written in the memory cell transistors of the second cell columns; and additionally writing electric charges into memory cell transistors in the first cell columns by amount equivalent to potential difference between target threshold voltage and the measured shifted threshold voltages of memory cell transistors in the first cell columns.

3. The programming method of claim 2, wherein said measuring shifted threshold voltages is implemented by verification of the memory cell transistors in the first cell columns.

4. The programming method of claim 3, wherein the verification of the memory cell transistors is executed after all of the first and second cell columns are initially programmed.

5. The programming method of claim 3, wherein the verification of the memory cell transistors is executed after fixing bit-line-potential of the other columns than the objective columns to a predetermined value.

6. The programming method of claim 2, wherein the initial electric charges is reduced by decreasing verify-potential of the memory cell transistors in the first cell columns so as to decrease threshold voltage of the first cell columns.

7. The programming method of claim 2, wherein the initial electric charges is reduced by increasing bit-line-potential of the first cell columns so as to decrease threshold voltage of the first cell columns.

* * * * *